(12) United States Patent
Ikegami et al.

(10) Patent No.: US 12,283,409 B2
(45) Date of Patent: Apr. 22, 2025

(54) VARIABLE CIRCUIT

(71) Applicant: Murata Manufacturing Co., Ltd., Kyoto (JP)

(72) Inventors: Katsuya Ikegami, Kyoto (JP); Wataru Takahashi, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 104 days.

(21) Appl. No.: 18/361,313

(22) Filed: Jul. 28, 2023

(65) Prior Publication Data

US 2023/0370040 A1    Nov. 16, 2023

Related U.S. Application Data

(63) Continuation of application No. PCT/JP2022/001612, filed on Jan. 18, 2022.

(30) Foreign Application Priority Data

Jan. 28, 2021    (JP) .................... 2021-012300

(51) Int. Cl.
*H01F 21/00*    (2006.01)
*H03H 7/01*    (2006.01)
*H03H 7/46*    (2006.01)
*H04B 1/18*    (2006.01)

(52) U.S. Cl.
CPC ........... *H01F 21/00* (2013.01); *H03H 7/0115* (2013.01); *H03H 7/461* (2013.01); *H04B 1/18* (2013.01)

(58) Field of Classification Search
CPC ......... H01F 21/00; H04B 1/18; H03H 7/0115; H03H 7/461
See application file for complete search history.

(56) References Cited

U.S. PATENT DOCUMENTS 6,664,881 B1    12/2003    Thompson et al.
2015/0097637 A1*    4/2015    Pye .............. H03H 7/0153
                                                    333/174
2022/0352859 A1*    11/2022    Ikegami ............ H03F 1/26

FOREIGN PATENT DOCUMENTS

CN    201112106 Y    9/2008
EP    0917162 B1 *    2/2006    ............ H01F 21/12
JP    H08-213472 A    8/1996
JP    2017-199784 A    11/2017

OTHER PUBLICATIONS

International Search Report for PCT/JP2022/001612 dated Apr. 19, 2022.

* cited by examiner

*Primary Examiner* — Patrick O'Neill
(74) *Attorney, Agent, or Firm* — McDonald Hopkins LLC

(57) ABSTRACT

A variable circuit includes a switch including a plurality of input terminals and a plurality of output terminals and an external wiring line. The multiple input terminals include a first input terminal to which a first input signal is inputted and a second input terminal to which a second input signal is inputted. The multiple output terminals include a first output terminal from which a first output signal is outputted and a second output terminal from which a second output signal is outputted. The switch is capable of forming at least one internal connection path electrically connecting any one of the multiple input terminals and any one of the multiple output terminals. The external wiring line is disposed outside the switch and is configured to electrically connect the second output terminal to the second input terminal.

7 Claims, 28 Drawing Sheets

VARIABLE CIRCUIT

CROSS REFERENCE TO RELATED APPLICATION

This is a continuation of International Application No. PCT/JP2022/001612 filed on Jan. 18, 2022 which claims priority from Japanese Patent Application No. 2021-012300 filed on Jan. 28, 2021. The contents of these applications are incorporated herein by reference in their entireties.

BACKGROUND OF THE DISCLOSURE

Field of the Disclosure

The present disclosure relates to a variable circuit.

Description of the Related Art

There is a variable inductance circuit having a variable inductance (see, for example, Patent Document 1).
- Patent Document 1: Japanese Unexamined Patent Application Publication No. 2017-199784
- Patent Document 2: Japanese Unexamined Patent Application Publication No. 8-213472

BRIEF SUMMARY OF THE DISCLOSURE

The variable inductance circuit disclosed in Patent Document 1 includes a plurality of series-connected inductors to which respective switches for electrically short-circuiting or opening across an inductor are connected in parallel.

When the switch is turned on, both ends of the corresponding inductor is electrically short-circuited and a current flows through the switch. On the other hand, when the switch is turned off, both ends of the corresponding inductor is electrically opened and a current flows through the inductor. Switching between the ON state and the OFF state of each of the switches changes the inductance of a variable inductance circuit. With a technique beyond such a technique, a variable circuit is required with which the increase in size is suppressed.

The present disclosure has been made in view of such circumstances, and it is a possible benefit of the present disclosure to provide a variable circuit with which the increase in size is suppressed.

A variable circuit according to an aspect of the present disclosure includes a switch including a plurality of input terminals and a plurality of output terminals and an external wiring line. The multiple input terminals include a first input terminal to which a first input signal is inputted and a second input terminal to which a second input signal is inputted. The multiple output terminals include a first output terminal from which a first output signal is outputted and a second output terminal from which a second output signal is outputted. The switch is capable of forming at least one internal connection path electrically connecting any one of the multiple input terminals and any one of the multiple output terminals. The external wiring line is disposed outside the switch and is configured to electrically connect the second output terminal to the second input terminal such that the second output signal outputted from the second output terminal is inputted to the second input terminal as the second input signal.

According to the present disclosure, a variable circuit is provided with which the increase in size is suppressed.

BRIEF DESCRIPTION OF THE SEVERAL VIEWS OF THE DRAWINGS

FIG. 23 is a circuit diagram of a variable circuit 13a.

DETAILED DESCRIPTION OF THE DISCLOSURE

Figure 1:
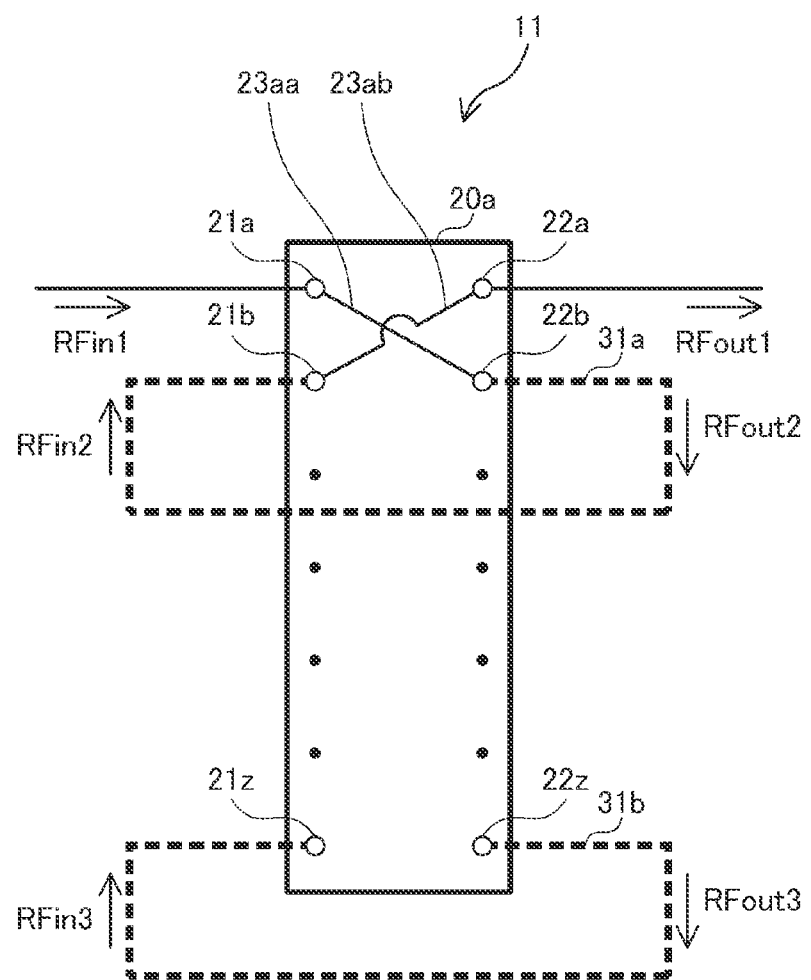
FIG. 1 is a circuit diagram of a variable circuit 11.

Embodiments of the present disclosure will be described in detail below with reference to the drawings. The same reference numeral is used to represent the same element, and the repeated explanation will be omitted as much as possible.

First Embodiment

A variable circuit according to the first embodiment will be described.

FIG. 1 is a circuit diagram of a variable circuit 11. As illustrated in FIG. 1, the variable circuit 11 includes a switch 20a and intra-substrate wiring lines 31a and 31b (external wiring lines). The switch 20a has a plurality of input terminals and a plurality of output terminals.

Of a plurality of input terminals, an input terminal 21a (first input terminal), an input terminal 21b (second input terminal), and an input terminal 21z (third input terminal) are illustrated in FIG. 1. Of a plurality of output terminals, an output terminal 22a (first output terminal), an output terminal 22b (second output terminal), and an output terminal 22z (third output terminal) are illustrated. Each of the input terminals 21a, 21b, and 21z may be hereinafter referred to as an input terminal 21. Each of the output terminals 22a, 22b, and 22z may be referred to as an output terminal 22. The number of input terminals 21 may be two or may be four or more. The number of output terminals 22 may be two or may be four or more. The number of input terminals 21 and the number of output terminals 22 may be the same or differ from each other.

In the present embodiment, an input terminal is a terminal to which a signal is inputted from the outside of the switch 20a. An output terminal is a terminal from which a signal is outputted to the outside of the switch 20a. In another embodiment, of the input terminals of a switch, there is a terminal from which a signal is outputted to the outside of the switch 20a. In another embodiment, of the output terminals of a switch, there is a terminal to which a signal is inputted from the outside of the switch 20a.

The switch 20a can form therein one or more connection paths (which may be hereinafter referred to as an internal connection paths) each electrically connecting any one of a plurality of input terminals and any one of a plurality of output terminals. A switch like the switch 20a is disclosed in, for example, Patent Document 2.

In the present embodiment, the switch 20a forms a single internal connection path for a single input terminal or a single output terminal. That is, in the switch 20a, the connection between a single input terminal and a plurality of output terminals is not established by a plurality of internal connection paths, and the connection between a plurality of input terminals and a single output terminal is not established by a plurality of internal connection paths. The switch 20a does not have such a direct mapping function.

Referring to FIG. 1, the switch 20a forms an internal connection path 23aa electrically connecting the input terminal 21a and the output terminal 22b and an internal connection path 23ab electrically connecting the input terminal 21b and the output terminal 22a.

The switch 20a is formed by, for example, a semiconductor such as a transistor or a diode. The switch 20a may be formed by a relay that switches between the connections by mechanically making or breaking a contact.

An input signal RFin1 (first input signal) is inputted from a preceding-stage circuit to the input terminal 21a. An output signal RFout1 (first output signal) is outputted from the output terminal 22a.

An output signal RFout2 (second output signal) is outputted from the output terminal 22b. An input signal RFin2 (second input signal) is inputted to the input terminal 21b.

An output signal RFout3 (third output signal) is outputted from the output terminal 22z. An input signal RFin3 (third input signal) is inputted to the input terminal 21z.

The intra-substrate wiring lines 31a and 31b are disposed outside the switch 20a. In the present embodiment, the intra-substrate wiring lines 31a and 31b are wiring lines disposed on, for example, a printed circuit board (PCB) such as a glass substrate or an epoxy substrate.

The intra-substrate wiring line 31a is configured to electrically connect the output terminal 22b to the input terminal 21b such that the output signal RFout2 outputted from the output terminal 22b is inputted to the input terminal 21b as the input signal RFin2. The intra-substrate wiring line 31b is configured to electrically connect the output terminal 22z to the input terminal 21z such that the output signal RFout3 outputted from the output terminal 22z is inputted to the input terminal 21z as the input signal RFin3.

In the present embodiment, each of the intra-substrate wiring lines 31a and 31b is, for example, partly or wholly wound on a printed circuit board and functions as an inductor. The intra-substrate wiring lines 31a and 31b may be formed of a surface-mounted device (SMD) that functions as an inductor and is disposed on the surface of a printed circuit board and a wiring line that electrically connects the SMD and the switch 20a. The details of the shapes of the intra-substrate wiring lines 31a and 31b will be described in detail below.

Figure 2:
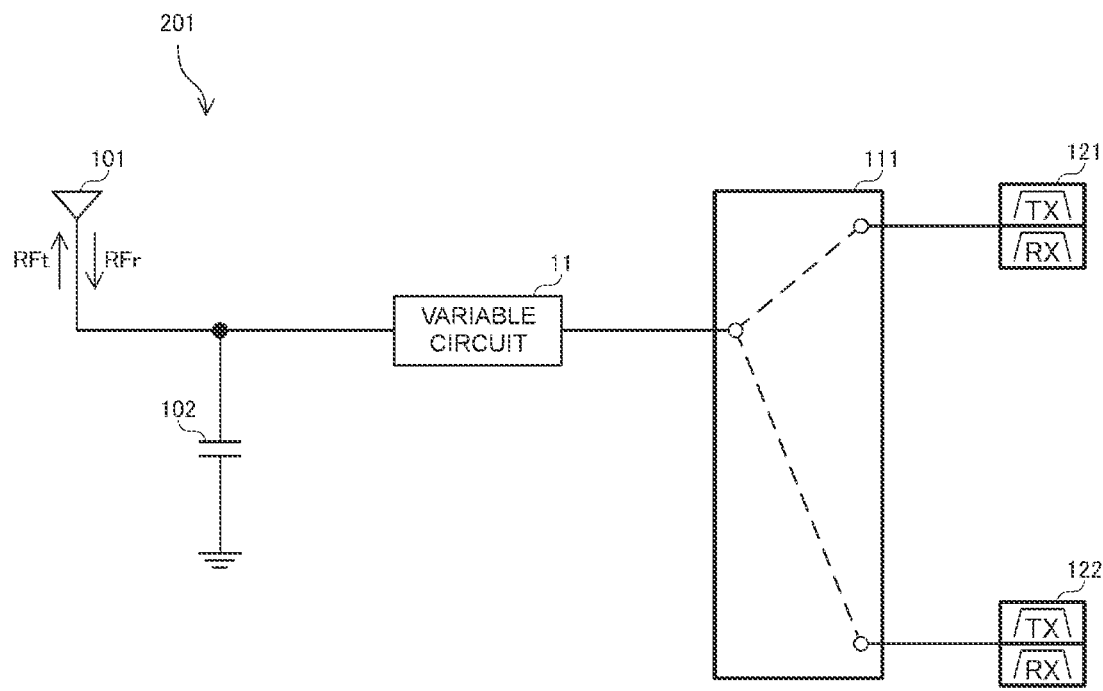
FIG. 2 is a diagram illustrating an exemplary application of the variable circuit 11 to a reception circuit 201.

FIG. 2 is a diagram illustrating an exemplary application of the variable circuit 11 to a reception circuit 201. As illustrated in FIG. 2, the reception circuit 201 includes the variable circuit 11, an antenna 101, a capacitor 102, an antenna switch 111, and filters 121 and 122.

As illustrated in FIGS. 1 and 2, the antenna 101 receives a radio frequency (RF) signal RFr and transmits an RF signal RFt. The RF signal RFr is transmitted from the antenna 101 to the filter 121 or 122 via the variable circuit 11 and the antenna switch 111. The RF signal RFt is transmitted from the filter 121 or 122 to the antenna 101 via the antenna switch 111 and the variable circuit 11.

Specifically, the input terminal 21a of the switch 20a in the variable circuit 11 is connected to the antenna 101 and is also connected to the ground via the capacitor 102. The antenna switch 111 has a first end connected to the output terminal 22a of the switch 20a in the variable circuit 11, a second end connected to the filter 121, and a third end connected to the filter 122.

The filter 121 includes a transmission filter and a reception filter used for, for example, the band having the band number of 8 (which may be hereinafter referred to as an 8th band). The filter 122 includes a transmission filter and a reception filter used for, for example, the band having the band number of 12 (which may be hereinafter referred to as a 12th band). The frequency of the 12th band is lower than that of the 8th band.

In a subsequent stage of each reception filter, for example, a low-noise amplifier (not illustrated) is disposed. In a preceding stage of each transmission filter, for example, a power amplifier (not illustrated) is disposed. In the reception circuit 201, a low-noise amplifier does not necessarily have to be disposed in the subsequent stage of each reception filter. In the reception circuit 201, a power amplifier does not necessarily have to be disposed in the preceding stage of each transmission filter.

For example, when the transmission/reception of radio waves in the 8th band is performed, the reception circuit 201 makes a transition to an 8th-band transmission/reception state. In the 8th-band transmission/reception state, the internal connection paths 23aa and 23ab are formed in the switch 20a (see FIG. 1).

Specifically, the input terminal 21a is connected to the output terminal 22b via the internal connection path 23aa in the switch 20a. The output terminal 22b is connected to the input terminal 21b via the intra-substrate wiring line 31a. The input terminal 21b is connected to the first end of the antenna switch 111 via the internal connection path 23ab and the output terminal 22a. In the antenna switch 111, the first end and the second end are connected.

Figure 3:
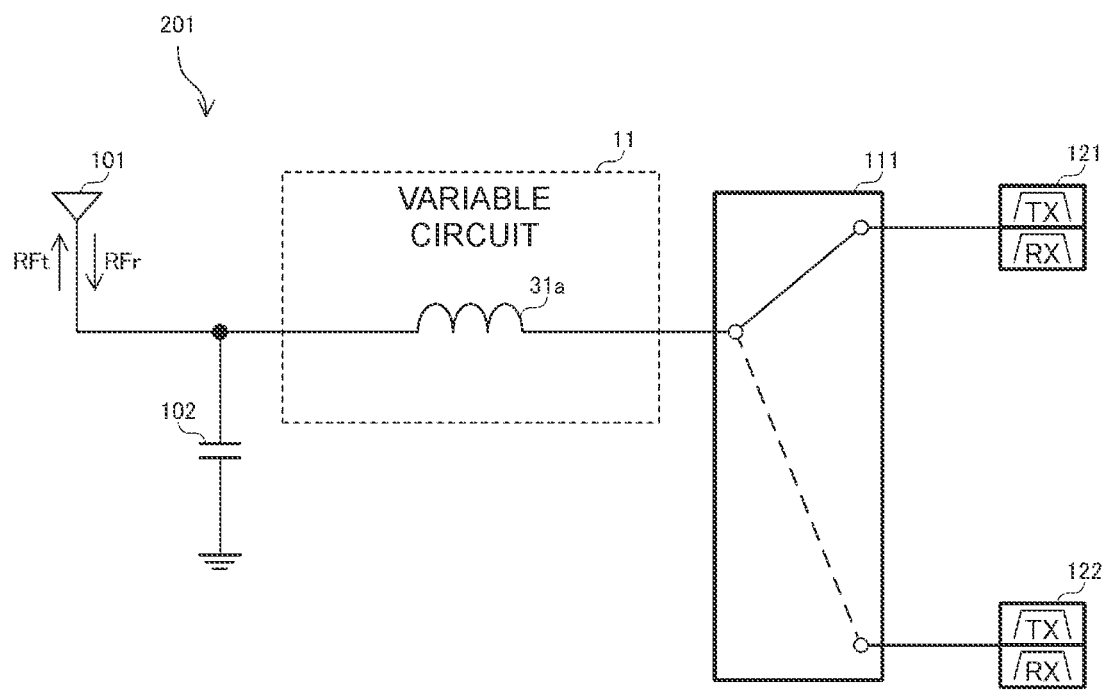
FIG. 3 is a diagram illustrating an equivalent circuit of the reception circuit 201 in an 8th-band transmission/reception state.

FIG. 3 is a diagram illustrating an equivalent circuit of the reception circuit 201 in the 8th-band transmission/reception state. As illustrated in FIG. 3, an intra-substrate wiring line 31a functioning as an inductor is connected between the antenna 101 and the first end of the antenna switch 111 in the equivalent circuit of the reception circuit 201. The intra-substrate wiring line 31a and the capacitor 102 function as a filter and also function as an impedance matching circuit.

Figure 4:
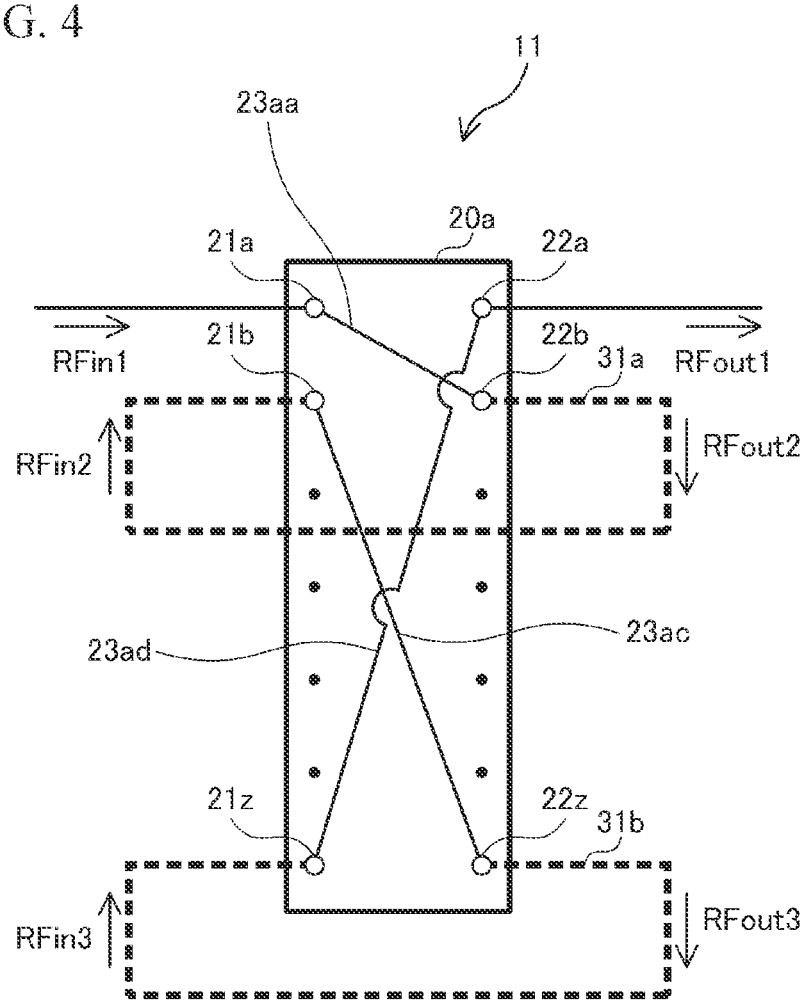
FIG. 4 is a circuit diagram of the variable circuit 11 in a 12th-band transmission/reception state.
Figure 5:
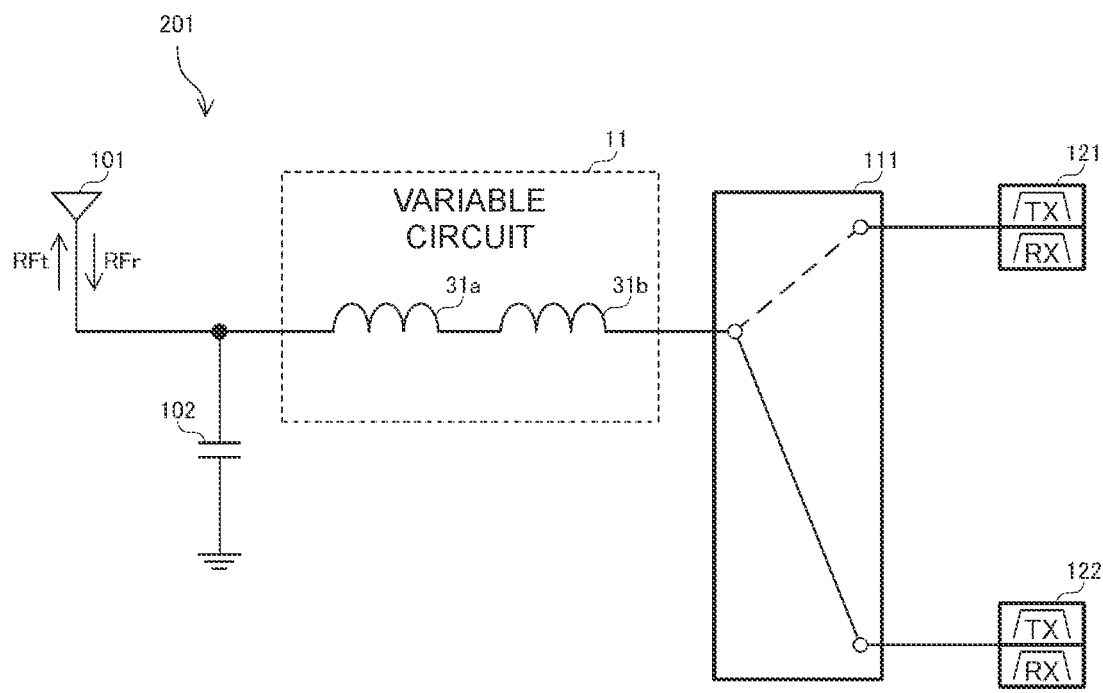
FIG. 5 is a diagram illustrating an equivalent circuit of the reception circuit 201 in the 12th-band transmission/reception state.

FIG. 4 is a circuit diagram of the variable circuit 11 in the 12th-band transmission/reception state. FIG. 5 is a diagram illustrating an equivalent circuit of the reception circuit 201 in the 12th-band transmission/reception state. For example, when the transmission/reception of radio waves in the 12th band is performed, the reception circuit 201 makes a transition to the 12th-band transmission/reception state as illustrated in FIGS. 2, 4, and 5.

In the 12th-band transmission/reception state, the internal connection path 23aa and internal connection paths 23ac and 23ad are formed in the switch 20a (see FIG. 4). The internal connection path 23ac electrically connects the input terminal 21b and the output terminal 22z in the switch 20a. The internal connection path 23ad electrically connects the input terminal 21z and the output terminal 22a in the switch 20a.

Accordingly, the input terminal 21a connected to the antenna 101 is connected to the input terminal 21b via the internal connection path 23aa, the output terminal 22b, and the intra-substrate wiring line 31a. The input terminal 21b is connected to the output terminal 22z via the internal connection path 23ac. The output terminal 22z is connected to the input terminal 21z via the intra-substrate wiring line 31b. The input terminal 21z is connected to the first end of the antenna switch 111 via the internal connection path 23ad and the output terminal 22a. The first end and the third end are connected in the antenna switch 111.

In the equivalent circuit of the reception circuit 201 (see FIG. 5), the intra-substrate wiring lines 31a and 31b functioning as series-connected inductors are connected between the antenna 101 and the first end of the antenna switch 111. The intra-substrate wiring lines 31a and 31b and the capacitor 102 function as a filter and also function as an impedance matching circuit.

Figure 6:
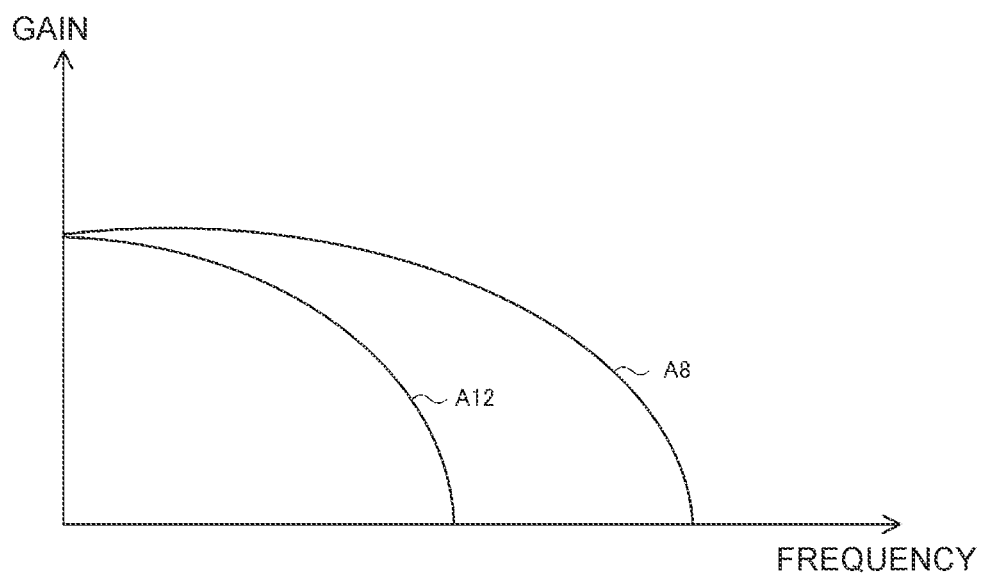
FIG. 6 is a diagram illustrating exemplary characteristics of a filter formed of the variable circuit 11 and a capacitor 102.

FIG. 6 is a diagram illustrating exemplary characteristics of a filter formed of the variable circuit 11 and the capacitor 102. Referring to FIG. 6, the horizontal axis represents frequency and the vertical axis represents gain. As illustrated in FIG. 6, an attenuation curve A8 represents, for example, the frequency change of the gain of a filter formed of the capacitor 102 and the variable circuit 11 in the 8th-band transmission/reception state. The filter having the frequency change of a gain represented by the attenuation curve A8 attenuates, for example, the third harmonic of a transmission wave in the 8th band. An attenuation curve A12 represents, for example, the frequency change of the gain of a filter formed of the capacitor 102 and the variable circuit 11 in the 12th-band transmission/reception state. The filter having the frequency change of a gain represented by the attenuation curve A12 attenuates, for example, the third harmonic of a transmission wave in the 12th band.

The inductance of the variable circuit 11 in the 12th-band transmission/reception state in which the intra-substrate wiring lines 31a and 31b functioning as inductors are connected in series is higher than that of the variable circuit 11 in the 8th-band transmission/reception state. Accordingly, a pole in the attenuation curve A12 moves toward a lower-frequency side as compared with a pole in the attenuation curve A8. That is, the variable circuit 11 and the capacitor 102 operate as a variable filter circuit.

The transition of the variable circuit 11 from the 8th-band transmission/reception state to the 12th-band transmission/reception state can provide the attenuation curve A12 located on the lower-frequency side. In contrast, the transition of the variable circuit 11 from the 12th-band transmission/reception state to the 8th-band transmission/reception state can provide the attenuation curve A8 located on the higher-frequency side.

(Layout)

An exemplary shape of an intra-substrate wiring line functioning as an inductor will be described.

Figure 7:
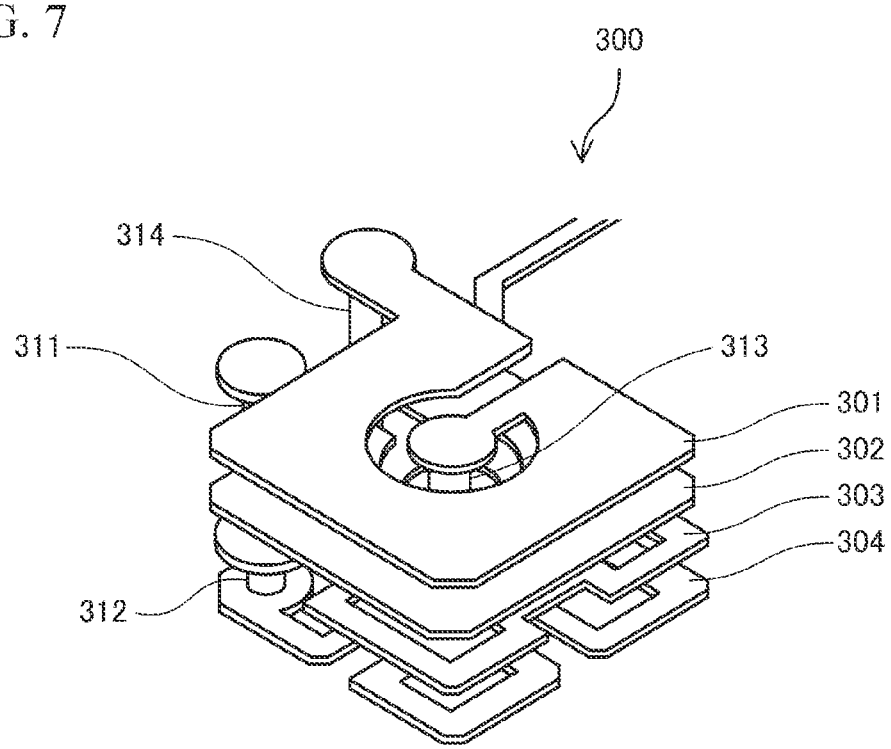
FIG. 7 is a perspective view of an intra-substrate wiring line 300 having an inductor function.
Figure 8:
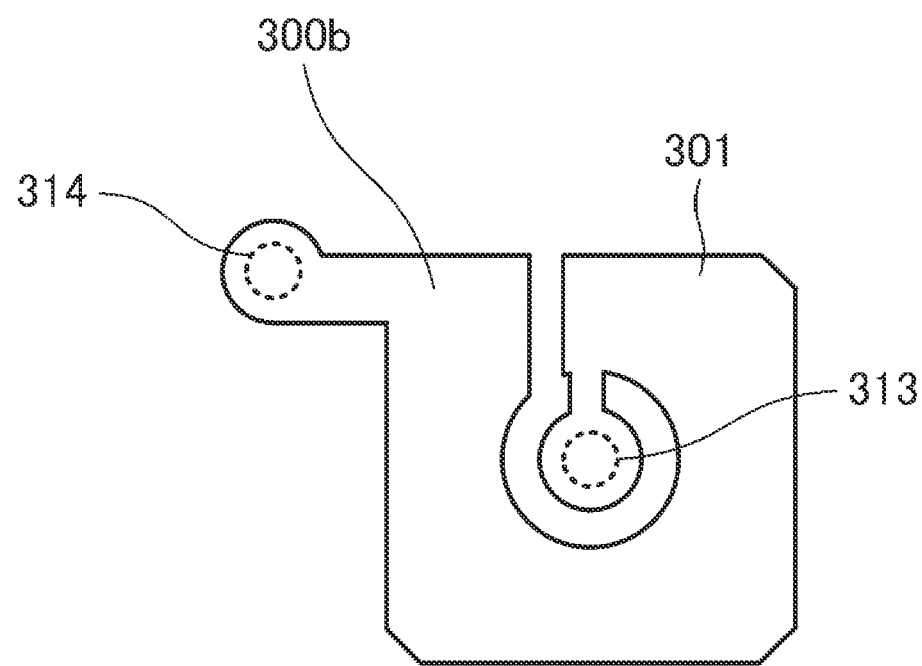
FIG. 8 is a plan view of a first-layer conductor 301 as viewed from above.
Figure 8:
Figure 9:
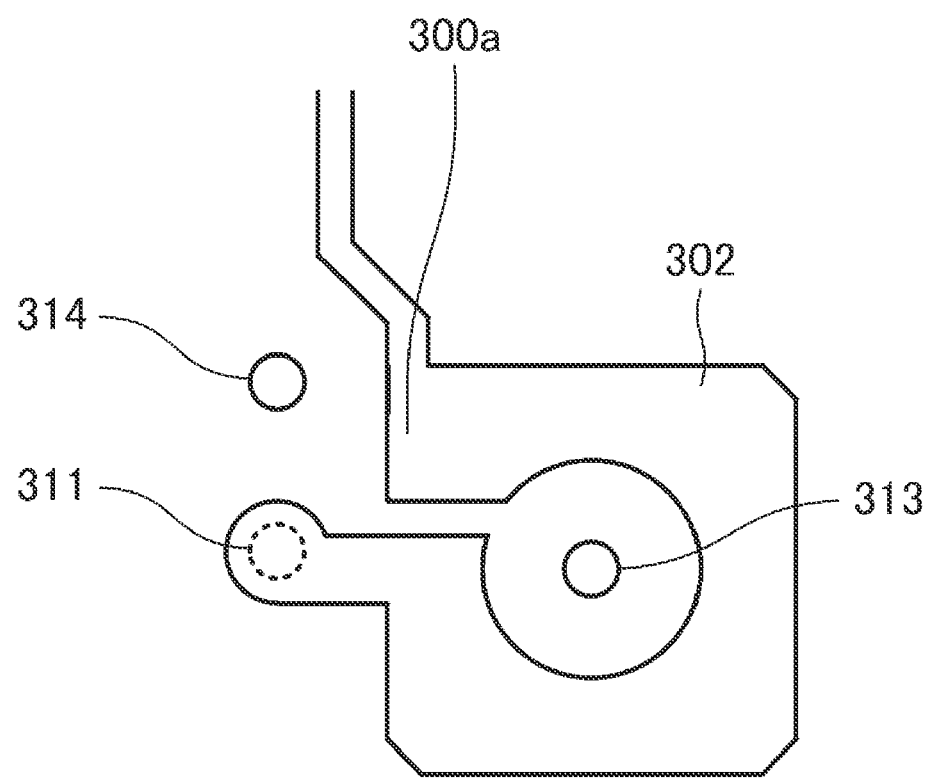
FIG. 9 is a plan view of a second-layer conductor 302 as viewed from above.
Figure 9:
Figure 10:
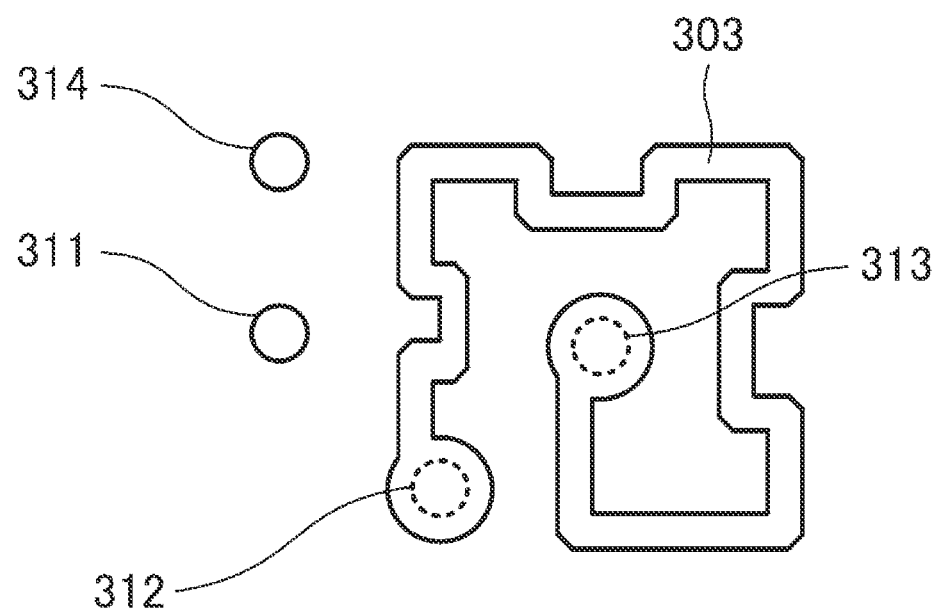
FIG. 10 is a plan view of a third-layer conductor 303 as viewed from above.
Figure 11:
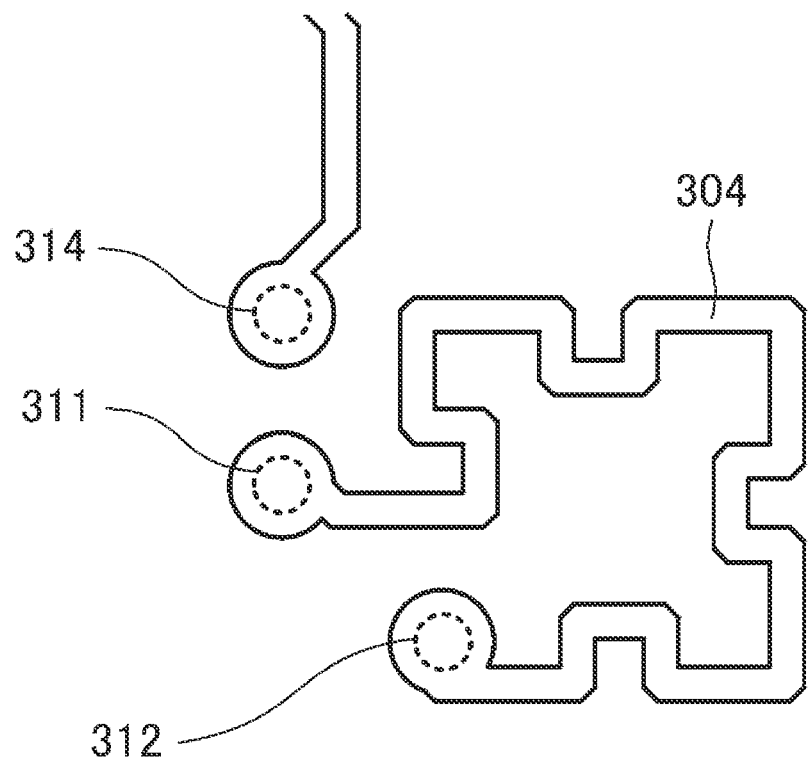
FIG. 11 is a plan view of a fourth-layer conductor 304 as viewed from above.
Figure 11:

FIG. 7 is a perspective view of an intra-substrate wiring line 300 functioning as an inductor. FIG. 8 is a plan view of a first-layer conductor 301 as viewed from above. FIG. 9 is a plan view of a second-layer conductor 302 as viewed from above. FIG. 10 is a plan view of a third-layer conductor 303 as viewed from above. FIG. 11 is a plan view of a fourth-layer conductor 304 as viewed from above.

Each drawing may illustrate the x axis, the y axis, and the z axis. The x axis, the y axis, and the z axis form three-dimensional orthogonal coordinates in the right-handed system. In the following, an arrow direction on the z axis is also referred to as a z-axis + side, a direction opposite to the arrow direction is also referred to as a z-axis − side. The same goes for the other axes. The z-axis + side and the z-axis − side are also referred to as an "upper side" and a "lower side", respectively. Here, a direction rotating in a clockwise direction when viewed from the upper side to the lower side is defined as a clockwise direction cw. A direction rotating in a counterclockwise direction when viewed from the upper side to the lower side is defined as a counterclockwise direction ccw.

As illustrated in FIGS. 7 to 11, the intra-substrate wiring line 300 includes the first-layer conductor 301, the second-layer conductor 302, the third-layer conductor 303, and the fourth-layer conductor 304 laminated in this order toward the lower side.

The second-layer conductor 302 has one end (which may be hereinafter referred to as a first end 300a) functioning as an input or output end of the intra-substrate wiring line 300 and the other end connected to a via 311 (see FIG. 9). The second-layer conductor 302 is wound around a via 313 in the clockwise direction cw from one end to the other end. The via 313 passes through the first layer to the third layer (see FIGS. 8 to 10). The via 311 passes through the second layer to the fourth layer (see FIGS. 9 to 11).

The fourth-layer conductor 304 has one end connected to the via 311 and the other end connected to a via 312 (see FIG. 11). The fourth-layer conductor 304 is wound in the clockwise direction cw from one end to the other end. The via 312 passes through the third layer to the fourth layer (see FIGS. 10 and 11).

The third-layer conductor 303 has one end connected to the via 312 and the other end connected to the via 313 (see FIG. 10). The third-layer conductor 303 is wound in the clockwise direction cw from one end to the other end.

The first-layer conductor 301 has one end connected to the via 313 and the other end (which may be hereinafter referred to as a second end 300b) functioning as an input or output end of the intra-substrate wiring line 300 (see FIG. 8). The first-layer conductor 301 is wound around the via 313 in the clockwise direction cw from one end to the other end. The second end 300b is connected to a via 314. The via 314 passes through the first layer to the fourth layer (see FIGS. 8 to 11).

Figure 12:
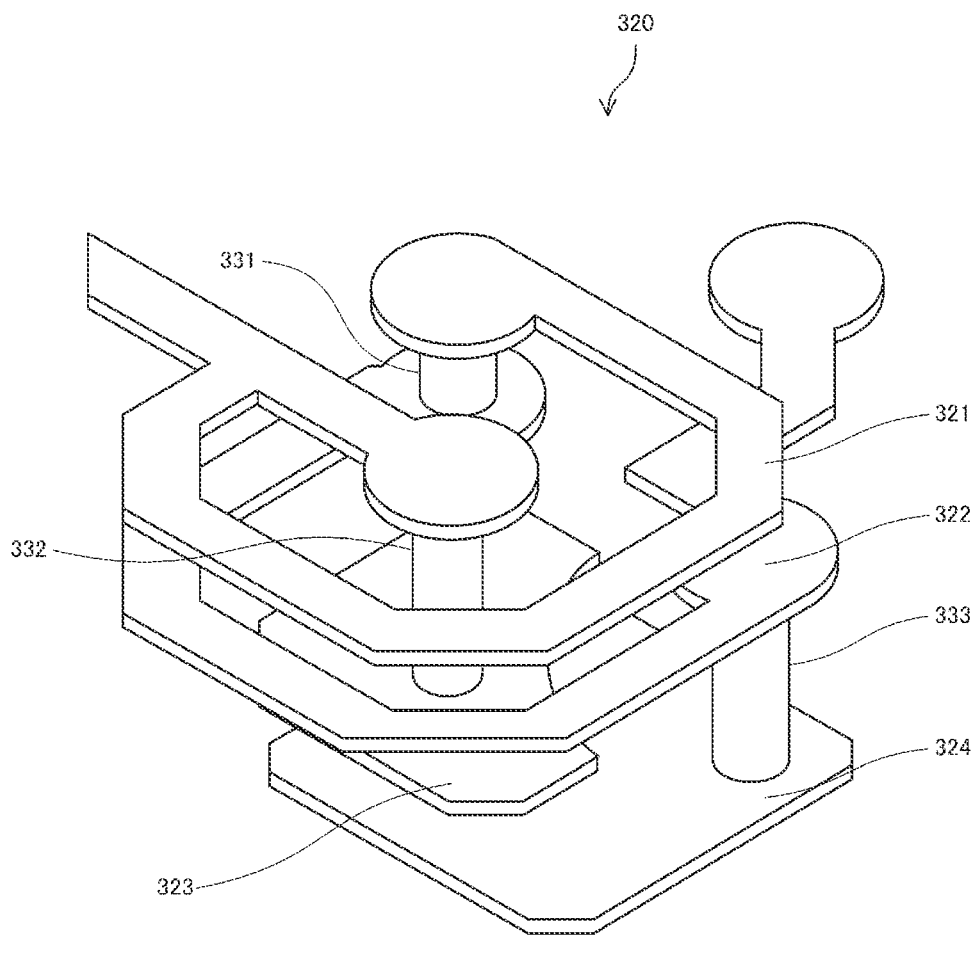
FIG. 12 is a perspective view of an intra-substrate wiring line 320 having an inductor function.
Figure 13:
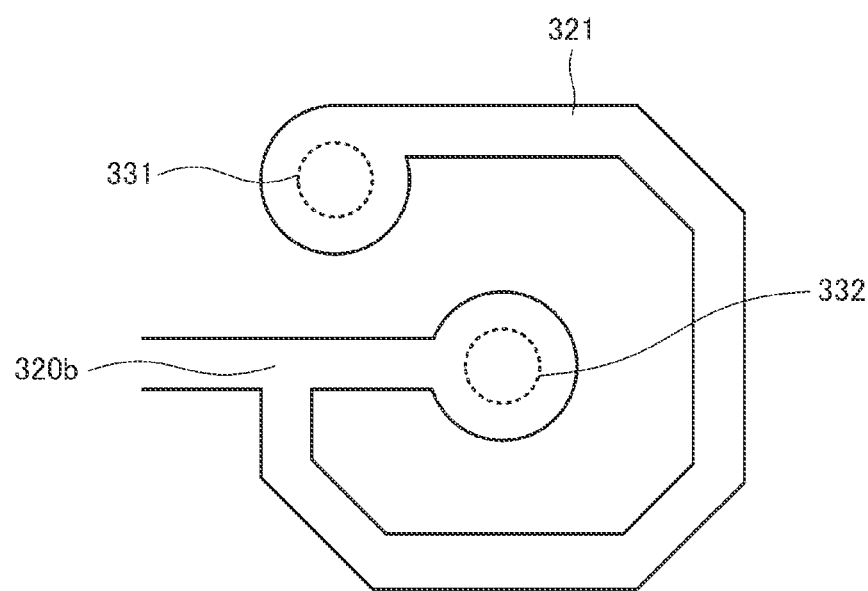
FIG. 13 is a plan view of a first-layer conductor 321 as viewed from above.
Figure 14:
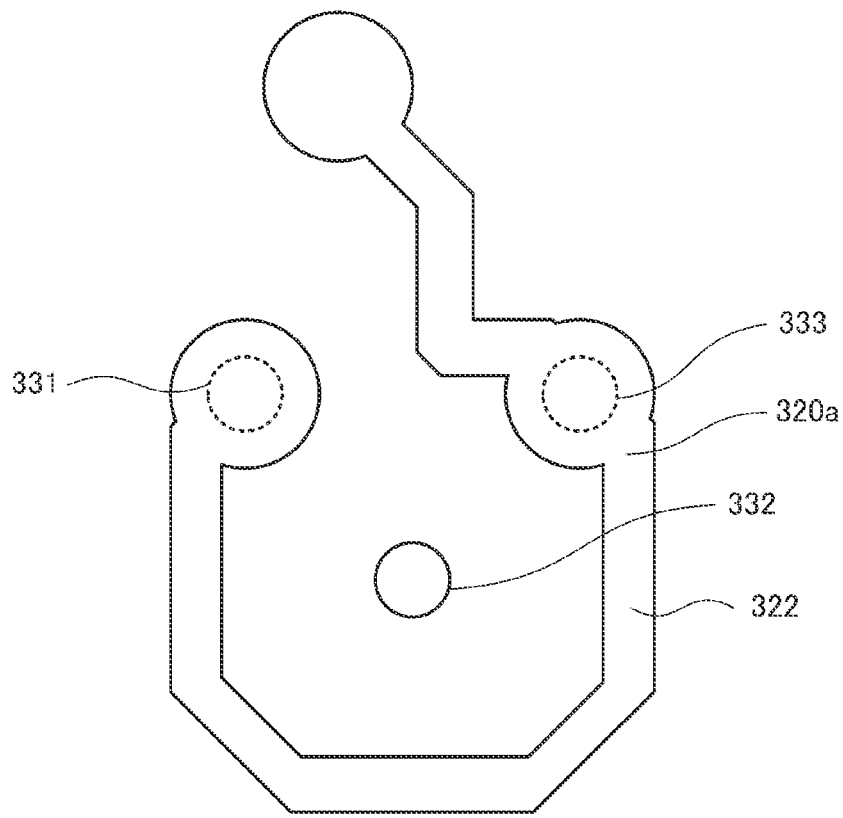
FIG. 14 is a plan view of a second-layer conductor 322 as viewed from above.
Figure 15:
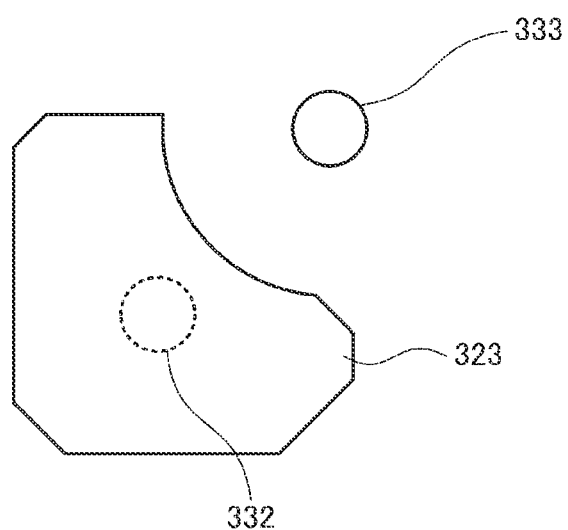
FIG. 15 is a plan view of a third-layer conductor 323 as viewed from above.
Figure 16:
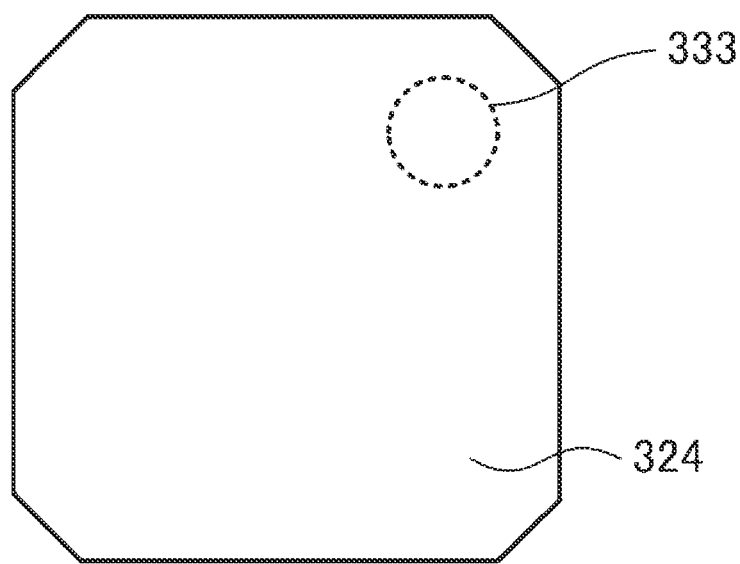
FIG. 16 is a plan view of a fourth-layer conductor 324 as viewed from above.
Figure 16:
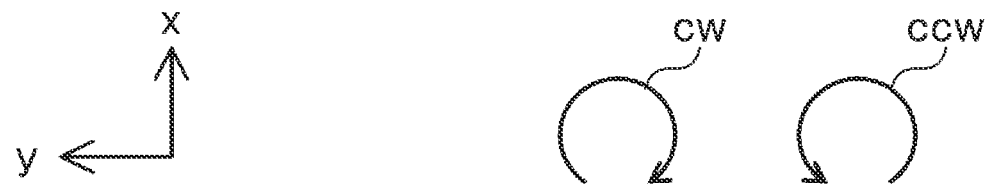

Another exemplary shape of an intra-substrate wiring line functioning as an inductor will be described. FIG. 12 is a perspective view of an intra-substrate wiring line 320 having an inductor function. FIG. 13 is a plan view of a first-layer conductor 321 as viewed from above. FIG. 14 is a plan view of a second-layer conductor 322 as viewed from above. FIG. 15 is a plan view of a third-layer conductor 323 as viewed from above. FIG. 16 is a plan view of a fourth-layer conductor 324 as viewed from above.

As illustrated in FIGS. 12 to 16, the intra-substrate wiring line 320 includes the first-layer conductor 321, the second-layer conductor 322, the third-layer conductor 323, and the fourth-layer conductor 324 laminated in this order toward the lower side.

The second-layer conductor 322 has one end (which may be hereinafter referred to as a first end 320a) functioning as an input or output end of the intra-substrate wiring line 320 and the other end connected to a via 331 (see FIG. 14). The second-layer conductor 322 is wound around a via 332 in the clockwise direction cw from one end to the other end. The via 331 passes through the first layer to the second layer (see FIGS. 13 and 14). The via 332 passes through the first layer to the third layer (see FIGS. 13 to 15).

The first-layer conductor 321 has one end connected to the via 331 and the other end (which may be hereinafter referred to as a second end 320b) functioning as an input or output end of the intra-substrate wiring line 320 (see FIG. 13). The first-layer conductor 321 is wound around the via 332 in the clockwise direction cw from one end to the second end 320b.

The third-layer conductor 323 is connected to the second end 320b of the first-layer conductor 321 via the via 332 (see FIGS. 13 and 15). The fourth-layer conductor 324 is connected to the first end 320a of the second-layer conductor 322 via a via 333 (see FIGS. 14 and 16).

Another exemplary shape of an intra-substrate wiring line functioning as an inductor will be described.

Figure 17:
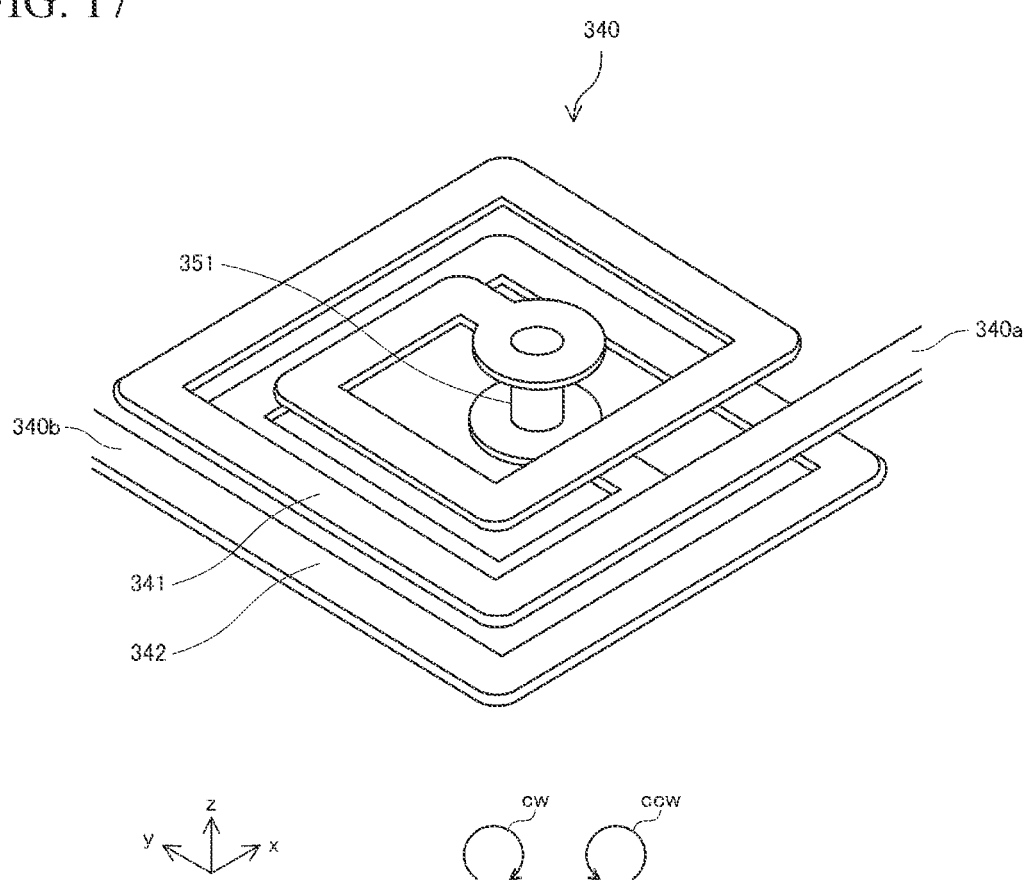
FIG. 17 is a perspective view of an intra-substrate wiring line 340 having an inductor function.

FIG. 17 is a perspective view of an intra-substrate wiring line 340 having an inductor function. As illustrated in FIG. 17, the intra-substrate wiring line 340 includes a first-layer conductor 341 and a second-layer conductor 342 laminated in this order toward the lower side.

The first-layer conductor 341 has one end (which may be hereinafter referred to as a first end 340a) functioning as an input or output end of the intra-substrate wiring line 340 and the other end connected to a via 351. The first-layer conductor 341 is wound in the clockwise direction cw from one end to the other end as approaching the via 351.

The via 351 passes through the first layer to the second layer.

The second-layer conductor 342 has one end connected to the via 351 and the other end (which may be hereinafter referred to as a second end 340b) functioning as an input or output end of the intra-substrate wiring line 340. The second-layer conductor 342 is wound in the clockwise direction cw from one end to the second end 340b as separating from the via 351.

The intra-substrate wiring lines 31a and 31b function as inductors by being formed in the same manner as the intra-substrate wiring line 300, 320, or 340.

Second Embodiment

A variable circuit according to the second embodiment will be described. In the second and following embodiments, the description of matters common to those in the first embodiment will be omitted and only different points will be described. In particular, the same advantageous effects obtained from the same configuration will not be mentioned in each embodiment.

Figure 18:
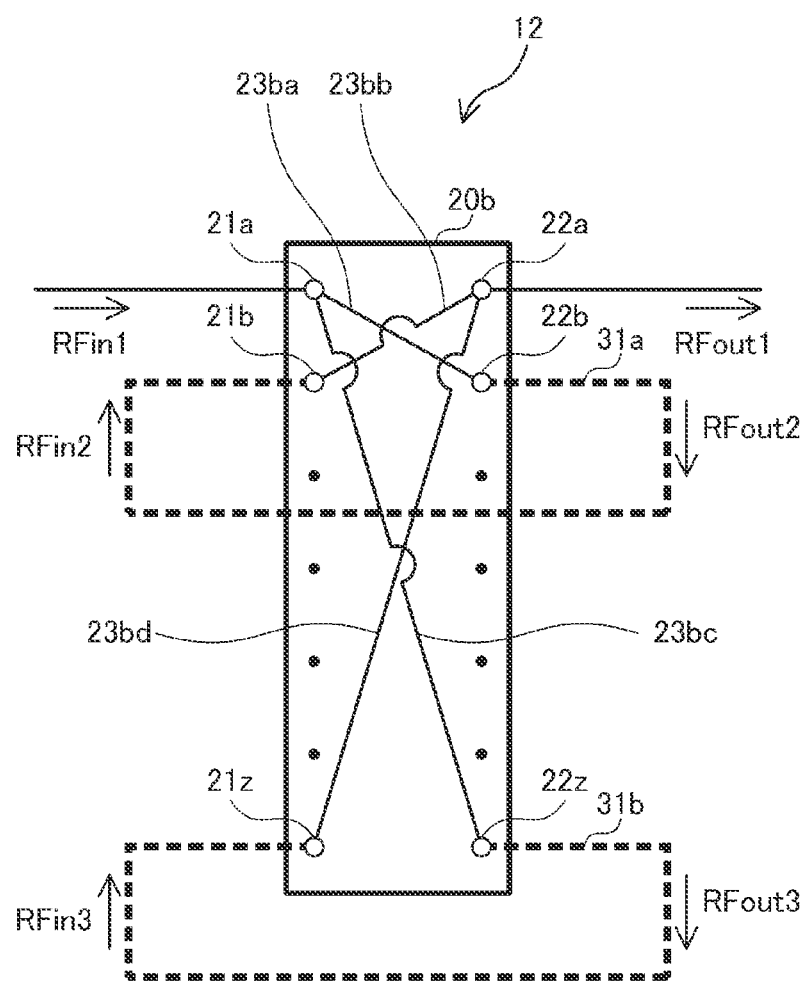
FIG. 18 is a circuit diagram of a variable circuit 12.

FIG. 18 is a circuit diagram of a variable circuit 12. As illustrated in FIG. 18, the variable circuit 12 according to the second embodiment differs from the variable circuit 11 according to the first embodiment in that the variable circuit 12 includes a switch having a direct mapping function.

The variable circuit 12 includes a switch 20b instead of the switch 20a in the variable circuit 11 illustrated in FIG. 1. The switch 20b forms, as the direct mapping function, a plurality of internal connection paths electrically connecting any one of a plurality of input terminals and two or more of a plurality of output terminals and can also form a plurality of internal connection paths electrically connecting two or more of the multiple input terminals and any one of the multiple output terminals. A switch like the switch 20b is disclosed in, for example, Patent Document 2.

Referring to FIG. 18, the switch 20b forms internal connection paths 23ba and 23bc that electrically connect the input terminal 21a to the output terminals 22b and 22z, respectively and internal connection paths 23bb and 23bd that electrically connect the output terminal 22a to the input terminals 21b and 21z, respectively.

Figure 19:
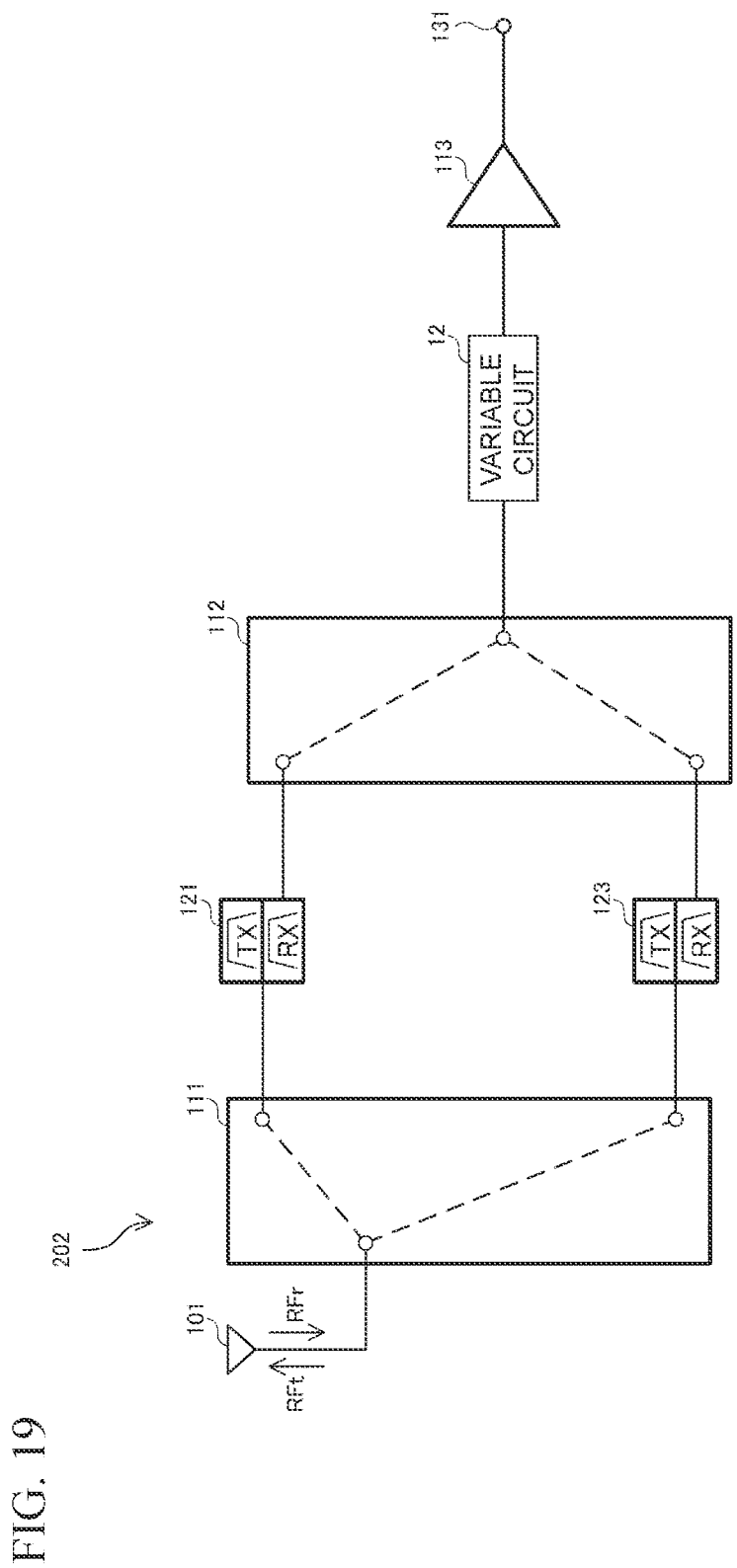
FIG. 19 is a diagram illustrating an exemplary application of the variable circuit 12 to a reception circuit 202.

FIG. 19 is a diagram illustrating an exemplary application of the variable circuit 12 to a reception circuit 202. As illustrated in FIG. 19, the reception circuit 202 includes the variable circuit 12, the antenna 101, the antenna switch 111, a switch 112, a low-noise amplifier 113, the filter 121, and a filter 123. The filter 123 includes a transmission filter and a reception filter used for, for example, the band having the band number of 20 (which may be hereinafter referred to as a 20th band).

As illustrated in FIGS. 18 and 19, the first end, the second end, and the third end of the antenna switch 111 are connected to the antenna 101, the filter 121, and the filter 123, respectively. The switch 112 have a first end connected to the reception filter in the filter 121, a second end connected to the reception filter in the filter 123, and a third end connected to the input terminal 21a of the switch 20b in the variable circuit 12. The low-noise amplifier 113 has an input end connected to the output terminal 22b of the switch 20b in the variable circuit 12 and an output end connected to an output terminal 131.

Figure 20:
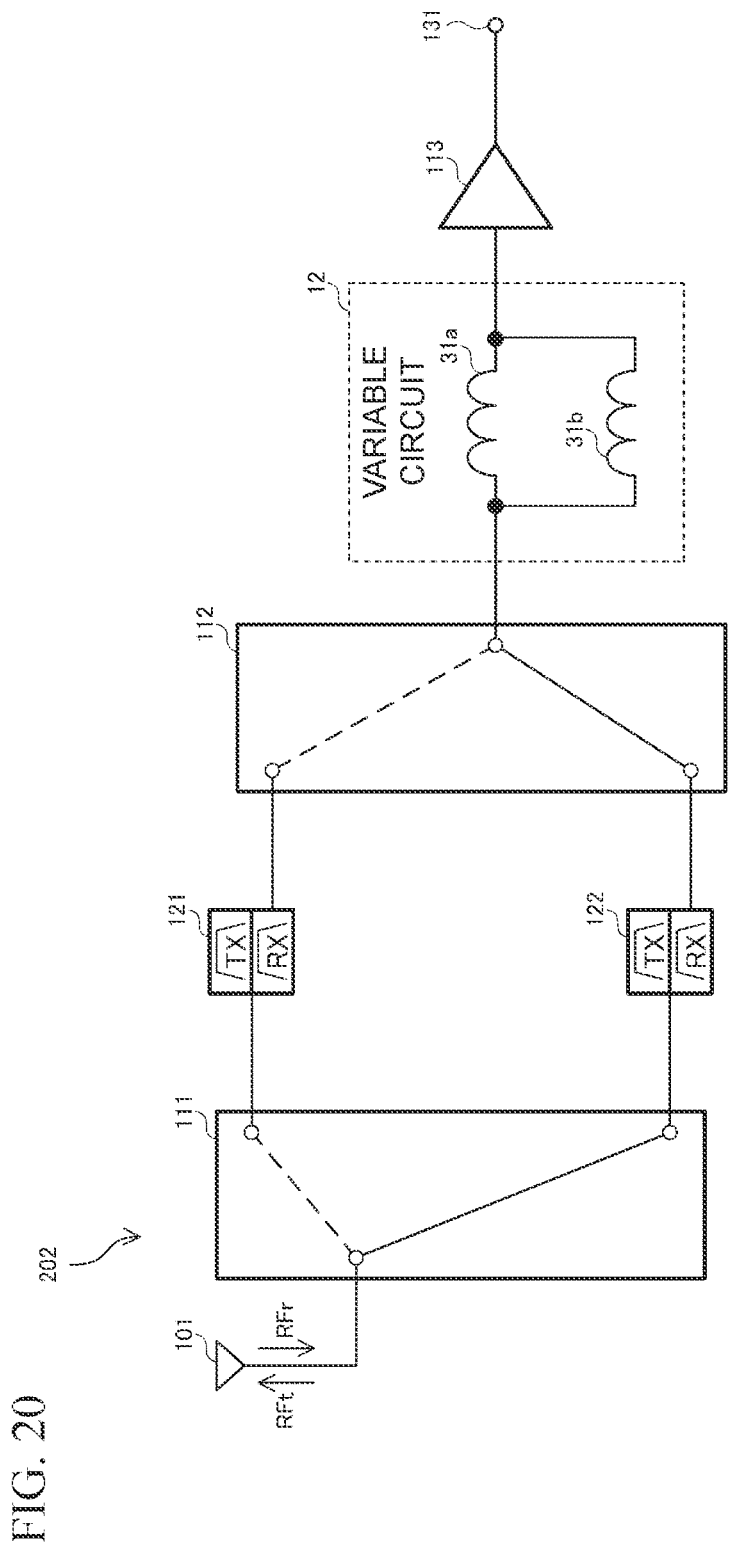
FIG. 20 is a diagram illustrating an equivalent circuit of the reception circuit 202 in a 20th-band transmission/reception state.

FIG. 20 is a diagram illustrating an equivalent circuit of the reception circuit 202 in a 20th-band transmission/reception state. For example, when the transmission/reception of radio waves in the 20th band is performed, the reception circuit 202 makes a transition to the 20th-band transmission/reception state as illustrated in FIGS. 18 and 20. In the 20th-band transmission/reception state, the first end and the third end are connected in the antenna switch 111 (see FIG. 20). In the switch 112, the second end and the third end are connected (see FIG. 20).

In the switch 20b, the internal connection paths 23ba, 23bb, 23bc, and 23bd are formed (see FIG. 18). Specifically, the input terminal 21a is connected to the output terminals 22b and 22z via the internal connection paths 23ba and 23bc, respectively. The output terminal 22b is connected to the input terminal 21b via the intra-substrate wiring line 31a. The output terminal 22z is connected to the input terminal 21z via the intra-substrate wiring line 31b. The input terminal 21b is connected to the output terminal 22a via the internal connection path 23bb. The input terminal 21z is connected to the output terminal 22a via the internal connection path 23bd.

In the equivalent circuit of the reception circuit 202 (see FIG. 20), the intra-substrate wiring lines 31a and 31b are connected in parallel in the variable circuit 12. That is, the variable circuit 12 functions as parallel-connected inductors.

Figure 21:
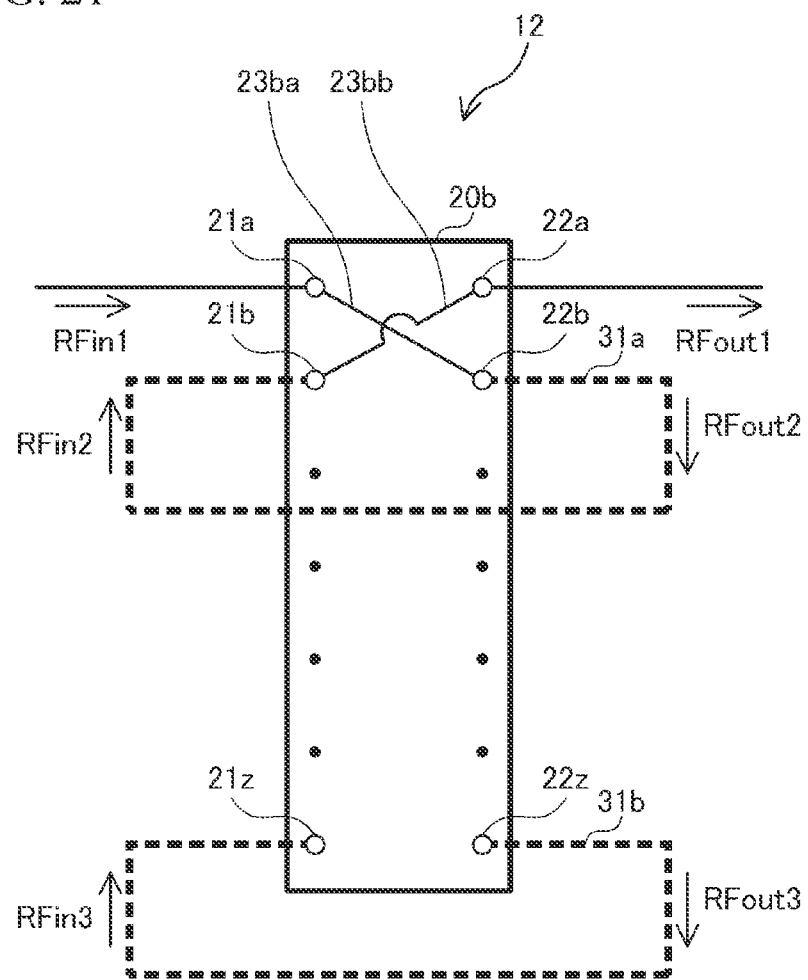
FIG. 21 is a circuit diagram of the variable circuit 12 in the 8th-band transmission/reception state.

FIG. 21 is a circuit diagram of the variable circuit 12 in the 8th-band transmission/reception state. For example, when the transmission/reception of radio waves in the 8th band is performed, the reception circuit 202 makes a transition to the 8th-band transmission/reception state as illustrated in FIGS. 19 and 21.

In the 8th-band transmission/reception state, the internal connection paths 23ba and 23bb are formed in the switch 20b (see FIG. 21).

Figure 22:
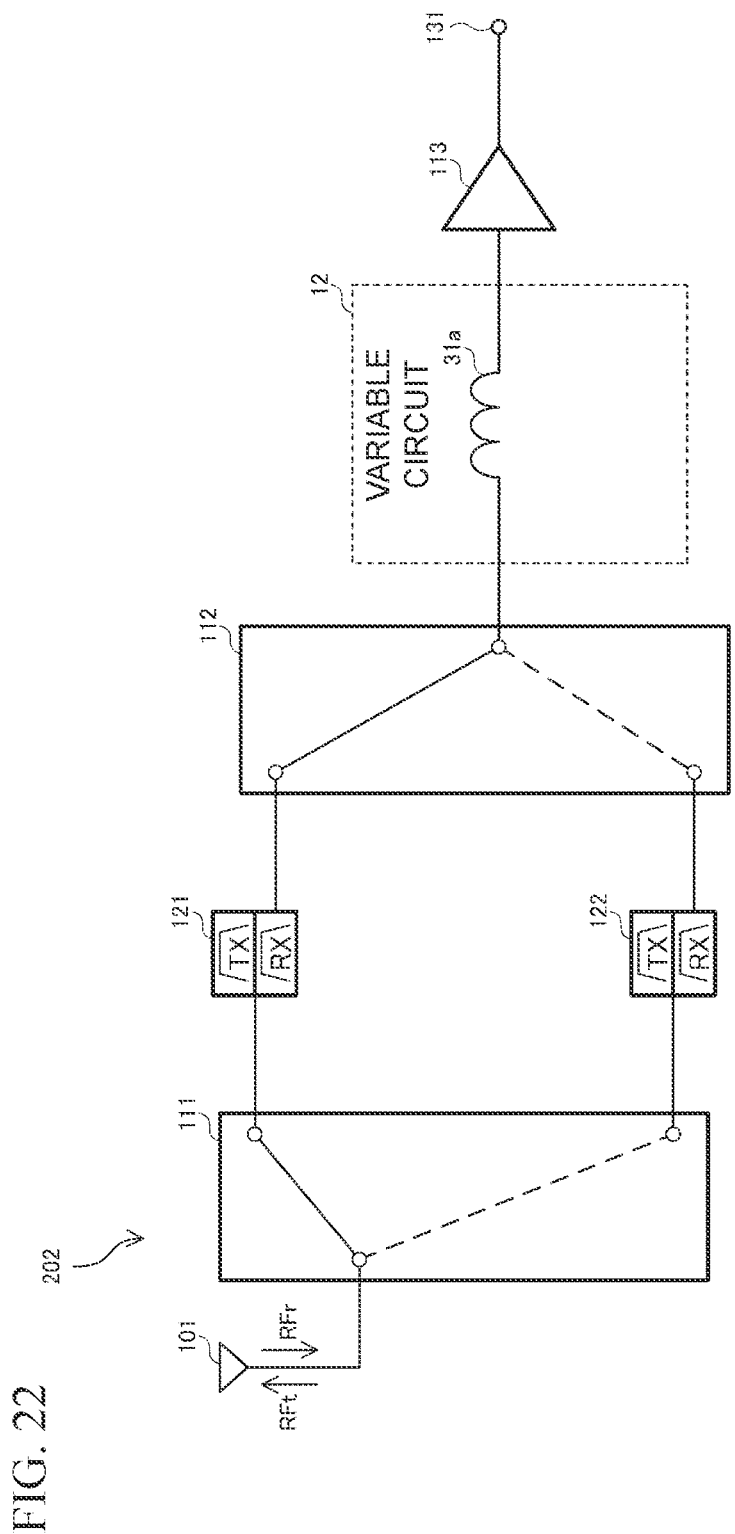
FIG. 22 is a diagram illustrating an equivalent circuit of the reception circuit 202 in the 8th-band transmission/reception state.

FIG. 22 is a diagram illustrating an equivalent circuit of the reception circuit 202 in the 8th-band transmission/reception state. As illustrated in FIGS. 21 and 22, the first end and the second end are connected in the antenna switch 111 in the 8th-band transmission/reception state (see FIG. 22). In the switch 112, the first end and the third end are connected (see FIG. 22).

In the switch 20b, the input terminal 21a is connected to the output terminal 22b via the internal connection path 23ba (see FIG. 21). The output terminal 22b is connected to the input terminal 21b via the intra-substrate wiring line 31a. The input terminal 21b is connected to the output terminal 22a via the internal connection path 23bb.

In the equivalent circuit of the reception circuit 202 (see FIG. 22), the intra-substrate wiring line 31a functioning as an inductor is connected between the third end of the switch 112 and the input end of the low-noise amplifier 113. That is, the variable circuit 12 is a variable inductor adjustment circuit, and, more specifically, is a matching adjustment circuit for the low-noise amplifier 113.

Third Embodiment

A variable circuit according to the third embodiment will be described.

Figure 23:
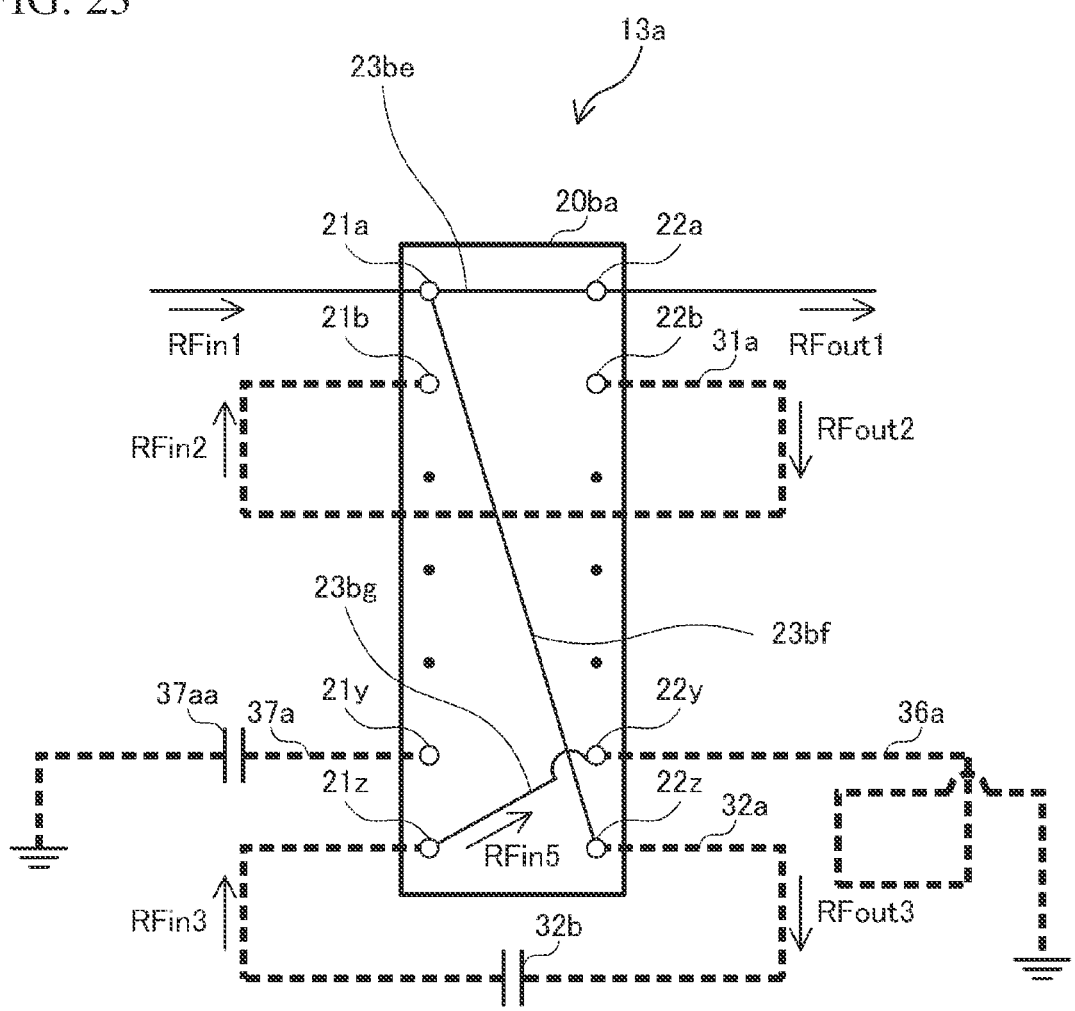
Figure 24:
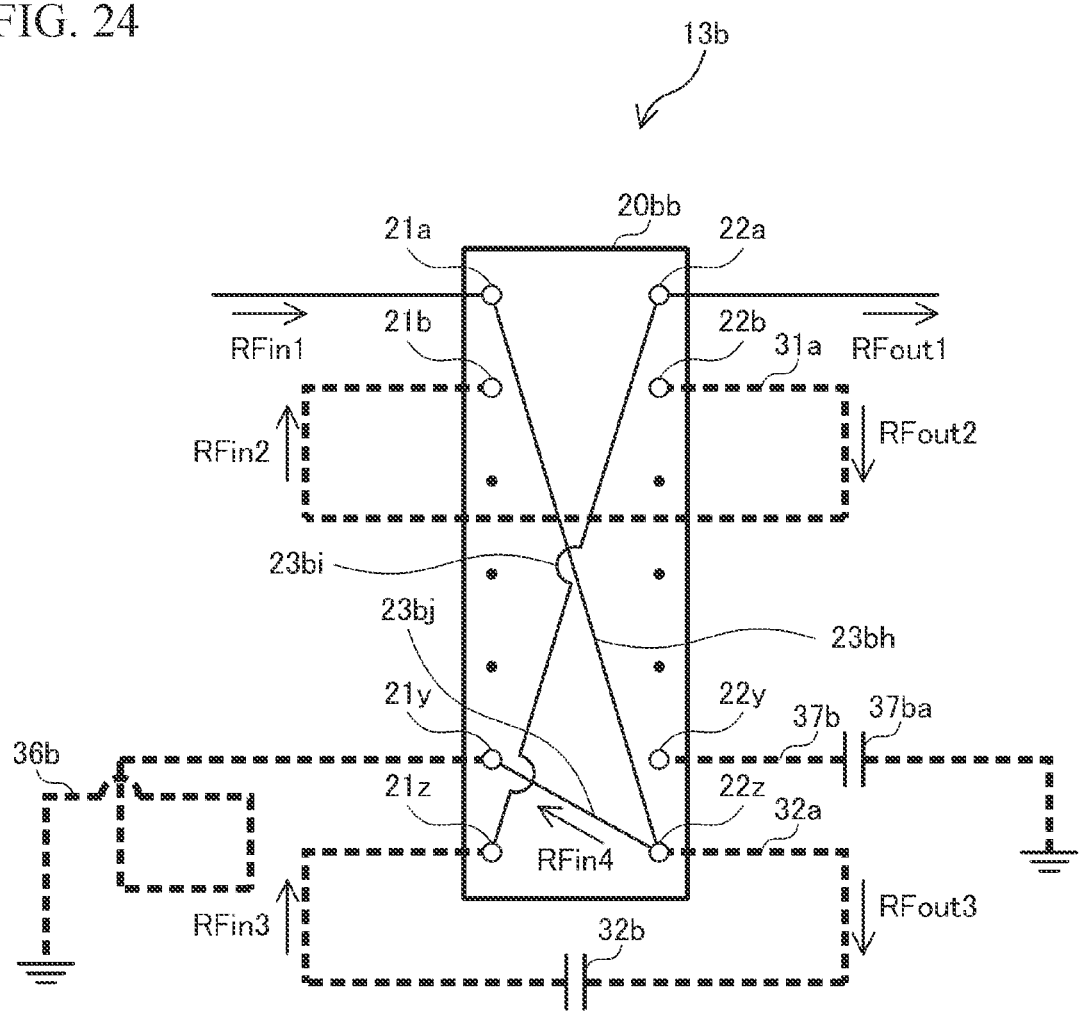
FIG. 24 is a circuit diagram of a variable circuit 13b.

FIG. 23 is a circuit diagram of a variable circuit 13a. FIG. 24 is a circuit diagram of a variable circuit 13b. As illustrated in FIGS. 23 and 24, a variable circuit according to the present embodiment differs from the variable circuit 12 according to the second embodiment in that a switch has an input terminal and an output terminal which are connected to the ground via respective intra-substrate wiring lines.

The variable circuit 13a (see FIG. 23) includes a switch 20ba and an intra-substrate wiring line 32a (external wiring line) instead of the switch 20b and the intra-substrate wiring line 31b in the variable circuit 12 illustrated in FIG. 18, respectively and further includes intra-substrate wiring lines 36a and 37a (external wiring lines).

The variable circuit 13b (see FIG. 24) includes a switch 20bb and the intra-substrate wiring line 32a (external wiring line) instead of the switch 20b and the intra-substrate wiring line 31b in the variable circuit 12 illustrated in FIG. 18, respectively and further includes intra-substrate wiring line 36b and 37b (external wiring lines).

The switches 20ba and 20bb have the direct mapping function like the switch 20b (see FIGS. 18 and 21).

Of the multiple input terminals 21, the input terminals 21a, 21b, and 21z and an input terminal 21y (fourth output terminal) are illustrated in FIGS. 23 and 24. Of the multiple output terminals 22, the output terminals 22a, 22b, and 22z and an output terminal 22y (fourth output terminal) are illustrated.

The switch 20ba in the variable circuit 13a forms internal connection paths 23be and 23bf that electrically connect the input terminal 21a to the output terminals 22a and 22z, respectively and an internal connection path 23bg electrically connecting the input terminal 21z and the output terminal 22y (see FIG. 23).

An input signal RFin5 (fourth input signal) is inputted to the output terminal 22y via the internal connection path 23bg. The output terminal 22y is connected to the ground via the intra-substrate wiring line 36a.

Specifically, the intra-substrate wiring line 36a has a first end electrically connected to the output terminal 22y and a second end connected to the ground. The intra-substrate wiring line 36a is disposed outside the switch 20ba. The intra-substrate wiring line 36a is wound on, for example, a printed circuit board and functions as an inductor.

The input terminal 21y is connected to the ground via the intra-substrate wiring lines 37a on which a capacitor 37aa (circuit element) is disposed. The capacitor 37aa is formed of, for example, a set of plate-shaped electrodes facing each other on a printed circuit board. The capacitor 37aa may be an SMD disposed on the surface of a printed circuit board.

The input terminal 21z and the output terminal 22z are electrically connected by the intra-substrate wiring line 32a on which a capacitor 32b (circuit element) is disposed. The capacitor 32b is formed of, for example, a set of plate-shaped electrodes facing each other on a printed circuit board. The capacitor 32b may be an SMD disposed on the surface of a printed circuit board.

The switch 20bb in the variable circuit 13b forms an internal connection path 23bh electrically connecting the input terminal 21a and the output terminal 22z, an internal connection path 23bi electrically connecting the input terminal 21z and the output terminal 22a, and an internal connection path 23bj electrically connecting the output terminal 22z and the input terminal 21y (see FIG. 24).

An input signal RFin4 (fourth input signal) is inputted to the input terminal 21y via the internal connection path 23bj. The input terminal 21y is connected to the ground via the intra-substrate wiring line 36b.

Specifically, the intra-substrate wiring line 36b has a first end electrically connected to the input terminal 21y and a second end connected to the ground. The intra-substrate wiring line 36b is disposed outside the switch 20bb. The intra-substrate wiring line 36b is wound on, for example, a printed circuit board and functions as an inductor.

The output terminal 22y is connected to the ground via an intra-substrate wiring line 37b on which a capacitor 37ba (circuit element) is disposed. The capacitor 37ba is formed of, for example, a set of plate-shaped electrodes facing each other on a printed circuit board. The capacitor 37ba may be an SMD disposed on the surface of a printed circuit board.

The input terminal 21z and the output terminal 22z are electrically connected by the intra-substrate wiring line 32a on which the capacitor 32b (circuit element) is disposed. The capacitor 32b is formed of, for example, a set of plate-shaped electrodes facing each other on a printed circuit board. The capacitor 32b may be an SMD disposed on the surface of a printed circuit board.

Figure 25:
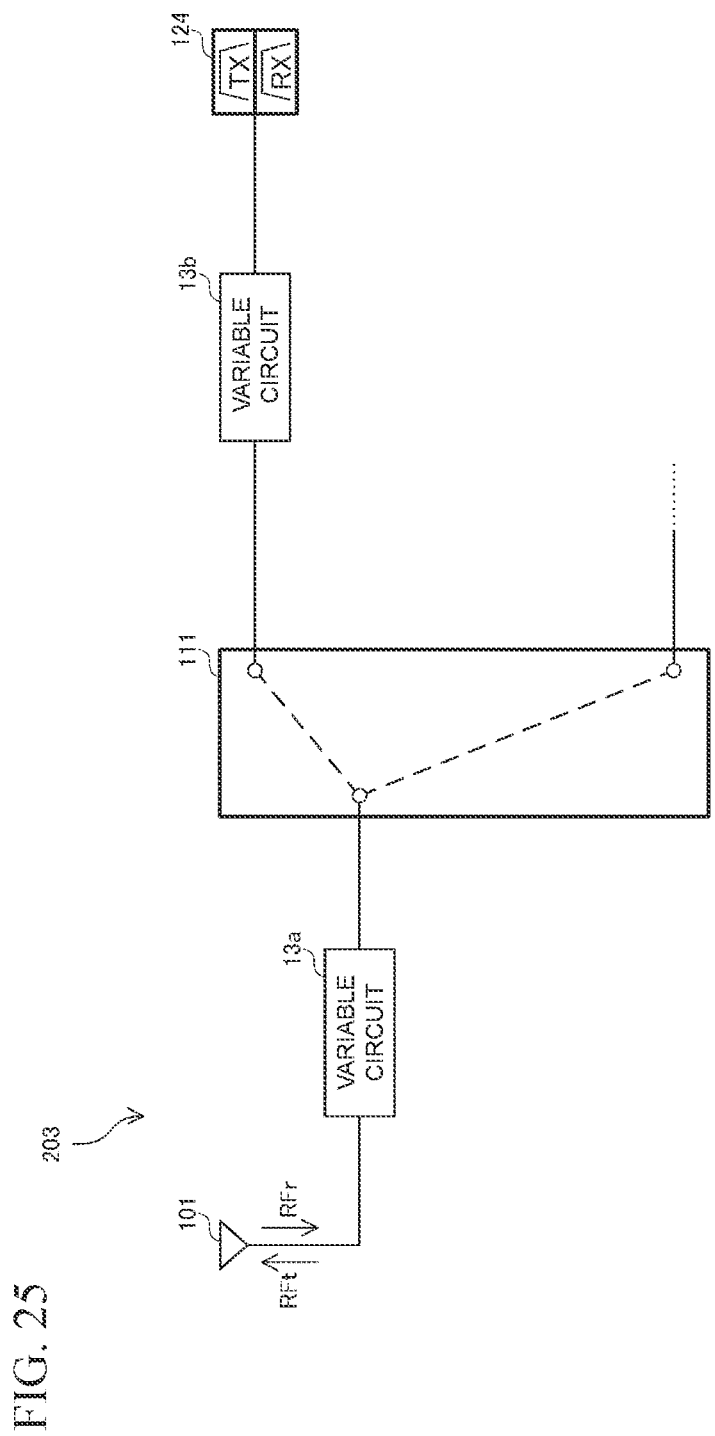
FIG. 25 is a diagram illustrating exemplary applications of the variable circuits 13a and 13b to a reception circuit 203.

FIG. 25 is a diagram illustrating exemplary applications of the variable circuits 13a and 13b to a reception circuit 203. As illustrated in FIG. 25, the reception circuit 203 includes the variable circuits 13a and 13b, the antenna 101, the antenna switch 111, and a filter 124. The filter 124 includes a transmission filter and a reception filter.

As illustrated in FIGS. 23 to 25, a first end of the antenna switch 111 is connected to the antenna 101 via the variable circuit 13a. A second end of the antenna switch 111 is connected to the filter 124 via the variable circuit 13b.

Figure 26:
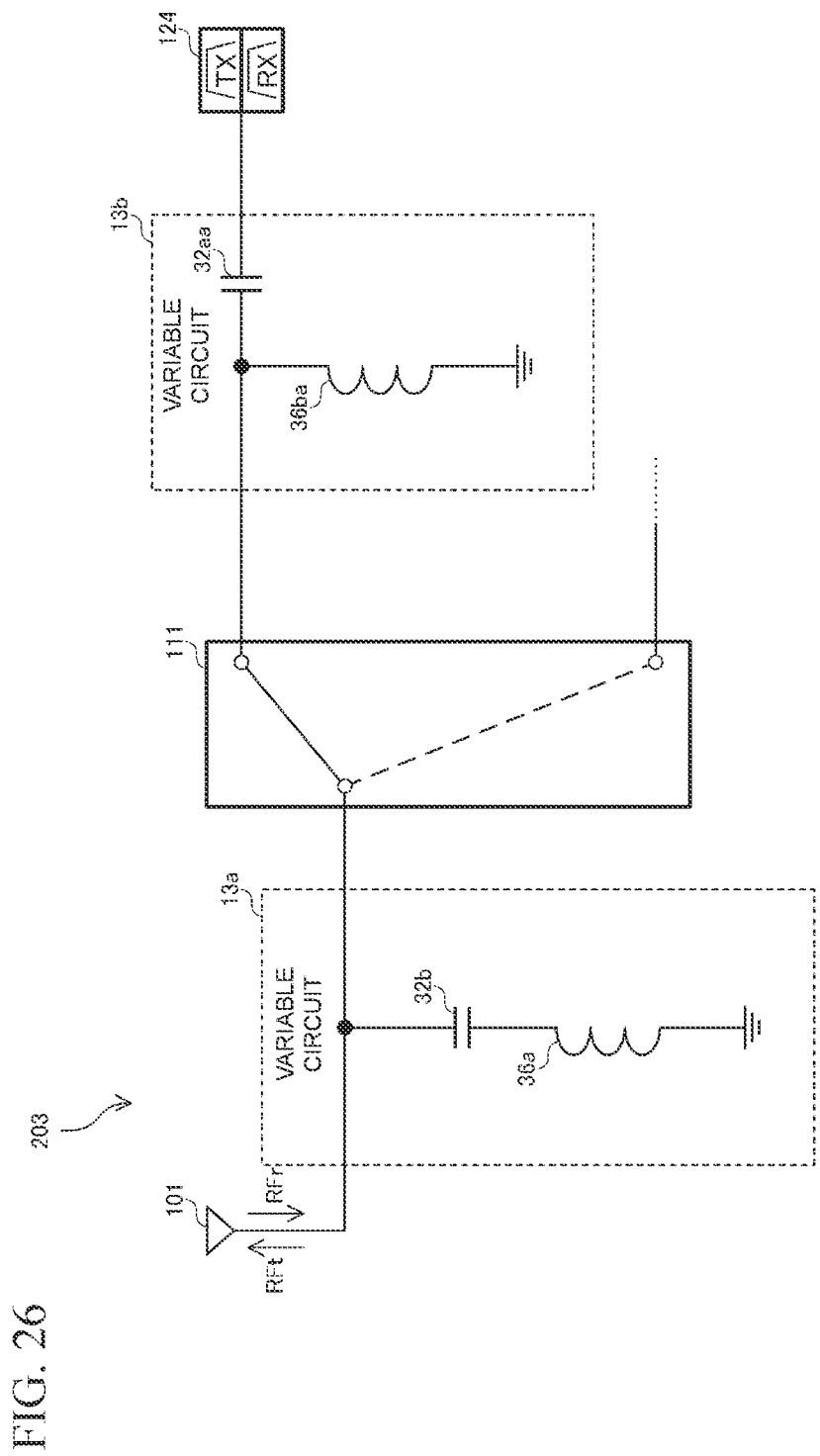
FIG. 26 is a diagram illustrating an equivalent circuit of the reception circuit 203.

FIG. 26 is a diagram illustrating an equivalent circuit of the reception circuit 203. As illustrated in FIGS. 23 to 26, the first end and the second end of the antenna switch 111 are connected in the equivalent circuit of the reception circuit 203 (see FIG. 26). The variable circuit 13a functions as a notch filter for harmonic suppression.

Specifically, the input terminal 21a of the switch 20ba in the variable circuit 13a is connected to the antenna 101. The input terminal 21a is connected to the first end of the antenna switch 111 via the internal connection path 23be and the output terminal 22a and is also connected to the output terminal 22z via an internal connection path 23bf. The output terminal 22z is connected to the input terminal 21z via the intra-substrate wiring line 32a on which the capacitor 32b is disposed. The input terminal 21z is connected to the ground via the internal connection path 23bg, the output terminal 22y, and the intra-substrate wiring line 36a.

That is, the variable circuit 13a is an LC series circuit disposed between the antenna 101 and the first end of the antenna switch 111 (see FIG. 26).

The variable circuit 13b functions as an LC filter and also functions as an impedance matching circuit. Specifically, the input terminal 21a of the variable circuit 13b is connected to the second end of the antenna switch 111. The input terminal 21a is connected to the output terminal 22z via the internal connection path 23bh. The output terminal 22z is connected to the input terminal 21y via the internal connection path 23bj and is also connected to the input terminal 21z via the intra-substrate wiring line 32a on which the capacitor 32b is disposed. The input terminal 21y is connected to the ground via the intra-substrate wiring line 36b. The input terminal 21z is connected to the filter 124 via the internal connection path 23bi and the output terminal 22a.

That is, the variable circuit 13b functions as a high pass filter disposed between the second end of the antenna switch 111 and the filter 124 and also functions as an impedance matching circuit.

Fourth Embodiment

A variable circuit according to the fourth embodiment will be described.

Figure 27:
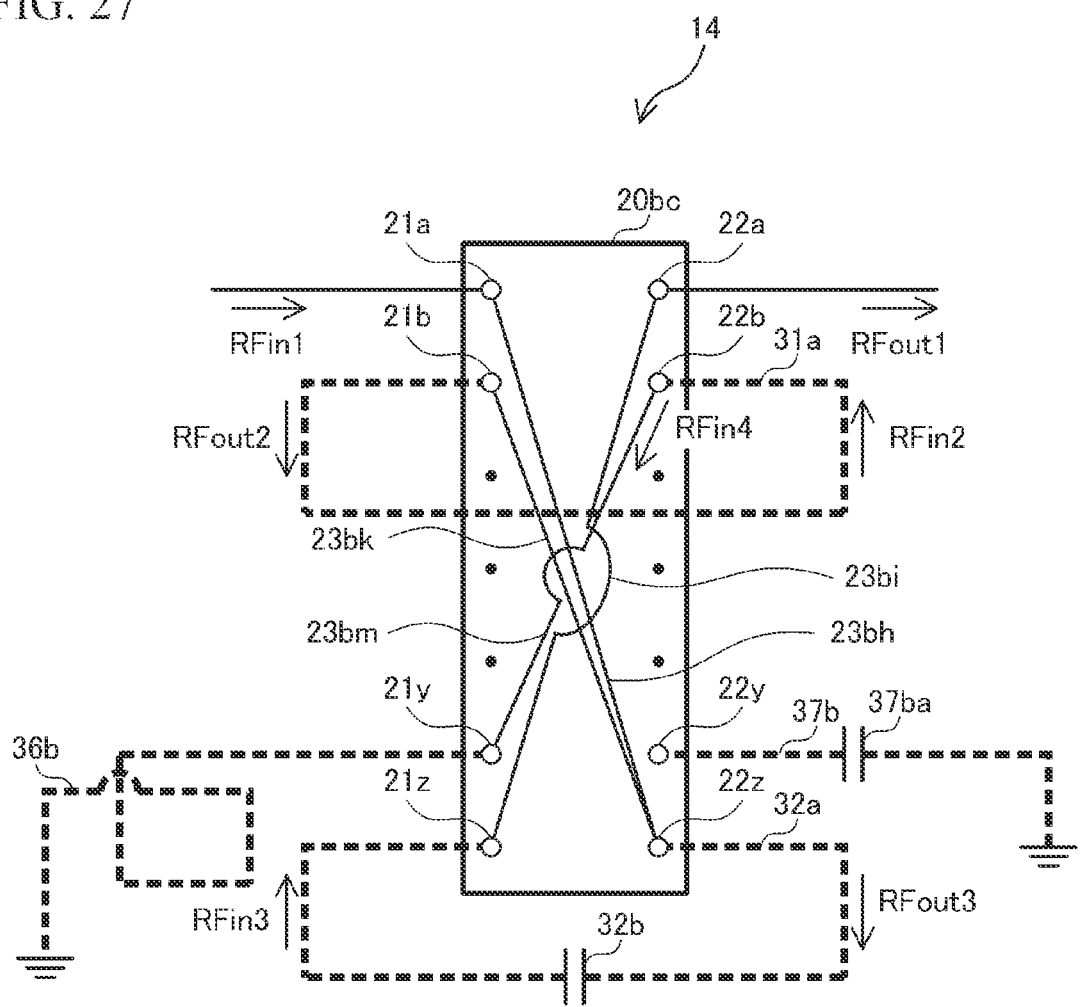
FIG. 27 is a circuit diagram of a variable circuit 14 in the 12th-band transmission/reception state.

FIG. 27 is a circuit diagram of a variable circuit 14 in the 12th-band transmission/reception state. As illustrated in FIG. 27, the variable circuit 14 according to the fourth embodiment differs from the variable circuit 12 according to the second embodiment in that the input terminal 21b and the output terminal 22b of a switch 20bc function as a second output terminal and a second input terminal, respectively.

The variable circuit 14 includes the switch 20bc and the intra-substrate wiring line 32a (external wiring line) instead of the switch 20b and the intra-substrate wiring line 31b in the variable circuit 12 illustrated in FIG. 18, respectively, and further includes the intra-substrate wiring lines 36b and 37b (external wiring lines).

The switch 20bc has the direct mapping function like the switch 20b (see FIGS. 18 and 21).

Of the multiple input terminals 21, the input terminals 21a, 21b (second output terminal), 21y (fourth output terminal), and 21z are illustrated in FIG. 27. Of the multiple output terminals 22, the output terminals 22a, 22b (second input terminal), 22y, and 22z are illustrated.

In the variable circuit 14, the intra-substrate wiring line 31a is configured to electrically connect the input terminal 21b to the output terminal 22b such that the output signal RFout2 outputted from the input terminal 21b is inputted to the output terminal 22b as the input signal RFin2.

The intra-substrate wiring lines 32a, 36b, and 37b are the same as the intra-substrate wiring lines 32a, 36b, and 37b illustrated in FIG. 24, respectively.

In the 12th-band transmission/reception state, the switch 20bc in the variable circuit 14 forms the internal connection paths 23bh, 23bi and internal connection paths 23bk and 23bm.

The internal connection path 23bh electrically connects the input terminal 21a and the output terminal 22z. The internal connection path 23bi electrically connects the input terminal 21z and the output terminal 22a. The internal connection path 23bk electrically connects the input terminal 21b and the output terminal 22z. The internal connection path 23bm electrically connects the input terminal 21y and the output terminal 22b.

Figure 28:
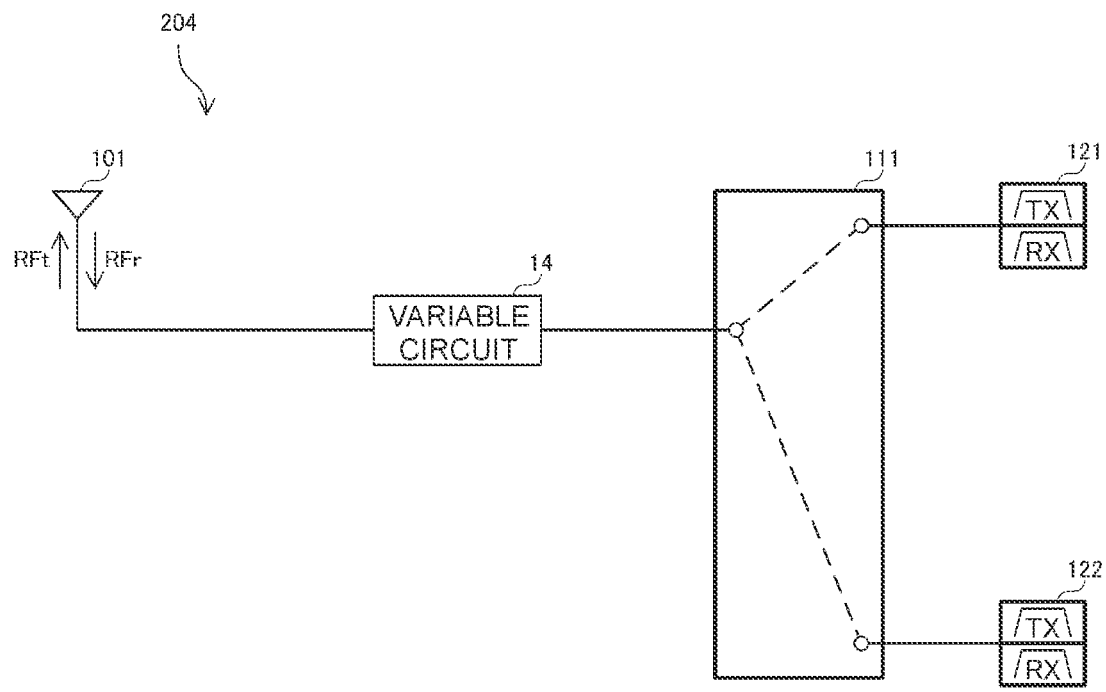
FIG. 28 is a diagram illustrating an exemplary application of the variable circuit 14 to a reception circuit 204.

FIG. 28 is a diagram illustrating an exemplary application of the variable circuit 14 to a reception circuit 204. As illustrated in FIG. 28, the reception circuit 204 includes the variable circuit 14 instead of the variable circuit 11 and the capacitor 102 in the reception circuit 201 illustrated in FIG. 2.

Figure 29:
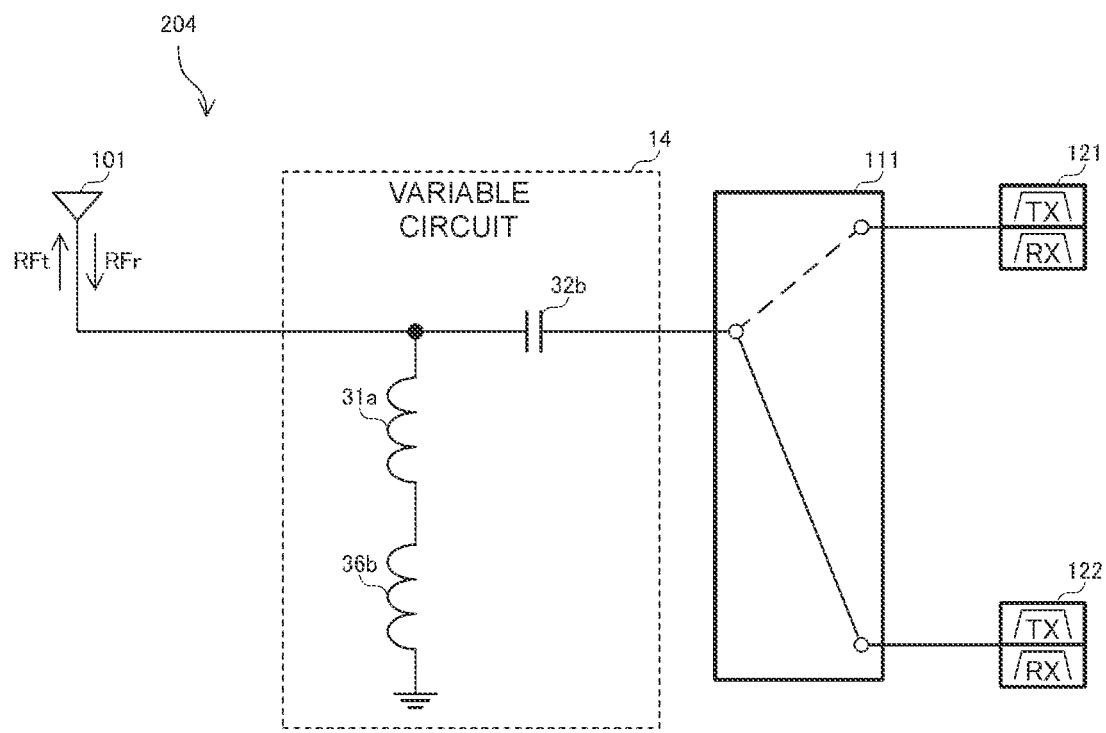
FIG. 29 is a diagram illustrating an equivalent circuit of the reception circuit 204 in the 12th-band transmission/reception state.

FIG. 29 is a diagram illustrating an equivalent circuit of the reception circuit 204 in the 12th-band transmission/reception state. For example, when the transmission/reception of radio waves in the 12th band is performed, the reception circuit 204 makes a transition to the 12th-band transmission/reception state as illustrated in FIG. 29. In the antenna switch 111 in the reception circuit 204, the first end connected to the variable circuit 14 and the third end connected to the filter 122 are connected in the 12th-band transmission/reception state.

As illustrated in FIGS. 27 and 29, the input terminal 21a connected to the antenna 101 is connected to the output terminal 22z via the internal connection path 23bh in the variable circuit 14. The output terminal 22z is connected to the input terminal 21b via the internal connection path 23bk and is also connected to the input terminal 21z via the intra-substrate wiring line 32a on which the capacitor 32b is disposed. The input terminal 21b is connected to the output terminal 22b via the intra-substrate wiring line 31a. The output terminal 22b is connected to the input terminal 21y via the internal connection path 23bm. The input signal RFin4 (fourth input signal) is inputted to the input terminal 21y via the internal connection path 23bm. The input terminal 21y is connected to the ground via the intra-substrate wiring line 36b. The input terminal 21z is connected to the first end of the antenna switch 111 via the internal connection path 23*bi* and the output terminal 22*a*.

That is, the antenna 101 is connected in series to the variable circuit 14, is connected to the ground via the intra-substrate wiring lines 31*a* and 36*b* functioning as inductors, and is connected to the first end of the antenna switch 111 via the capacitor 32*b* in the variable circuit 14.

Figure 30:
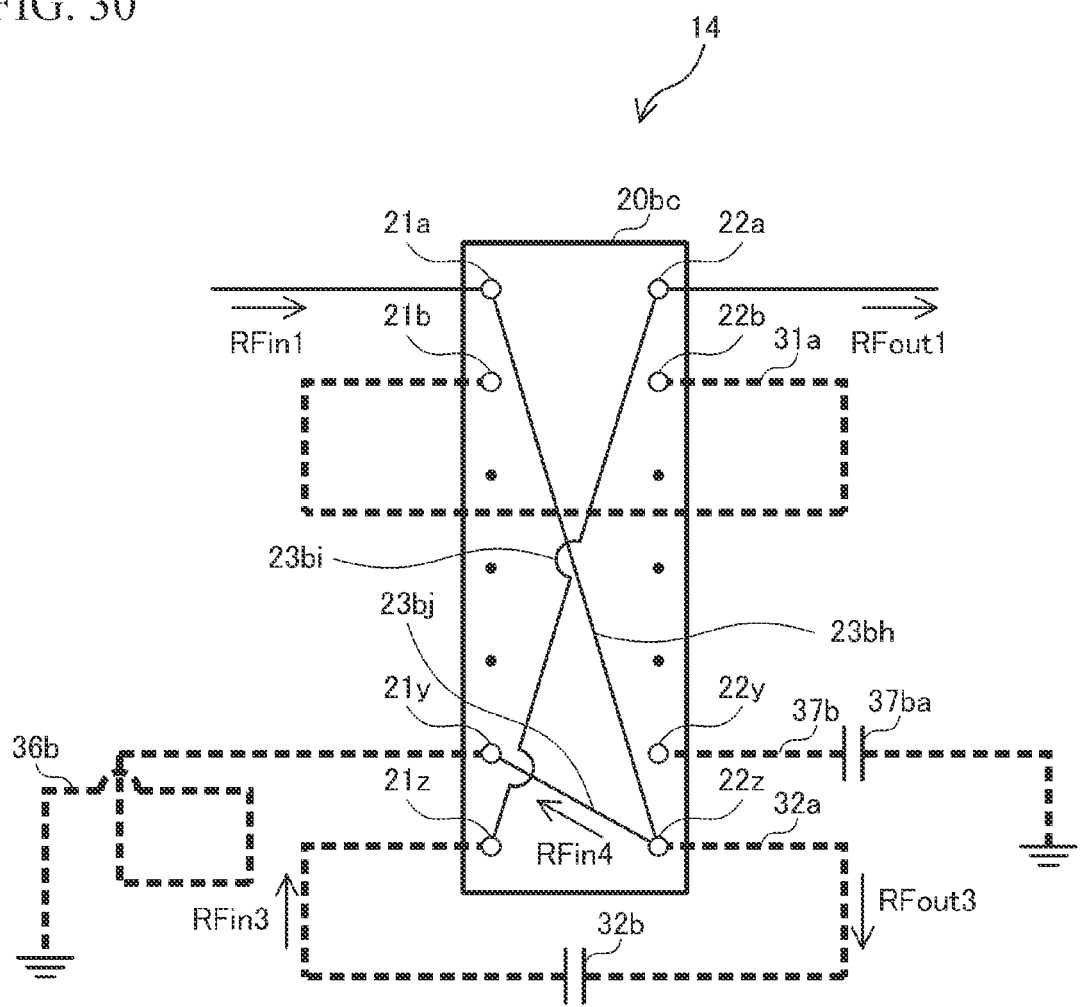
FIG. 30 is a circuit diagram of the variable circuit 14 in the 8th-band transmission/reception state.

FIG. 30 is a circuit diagram of the variable circuit 14 in the 8th-band transmission/reception state. As illustrated in FIG. 30, the switch 20*bc* in the variable circuit 14 forms the internal connection paths 23*bk* and 23*bi* and an internal connection path 23*bj* in the 8th-band transmission/reception state. The internal connection path 23*bj* electrically connects the input terminal 21*y* and the output terminal 22*z*.

Figure 31:
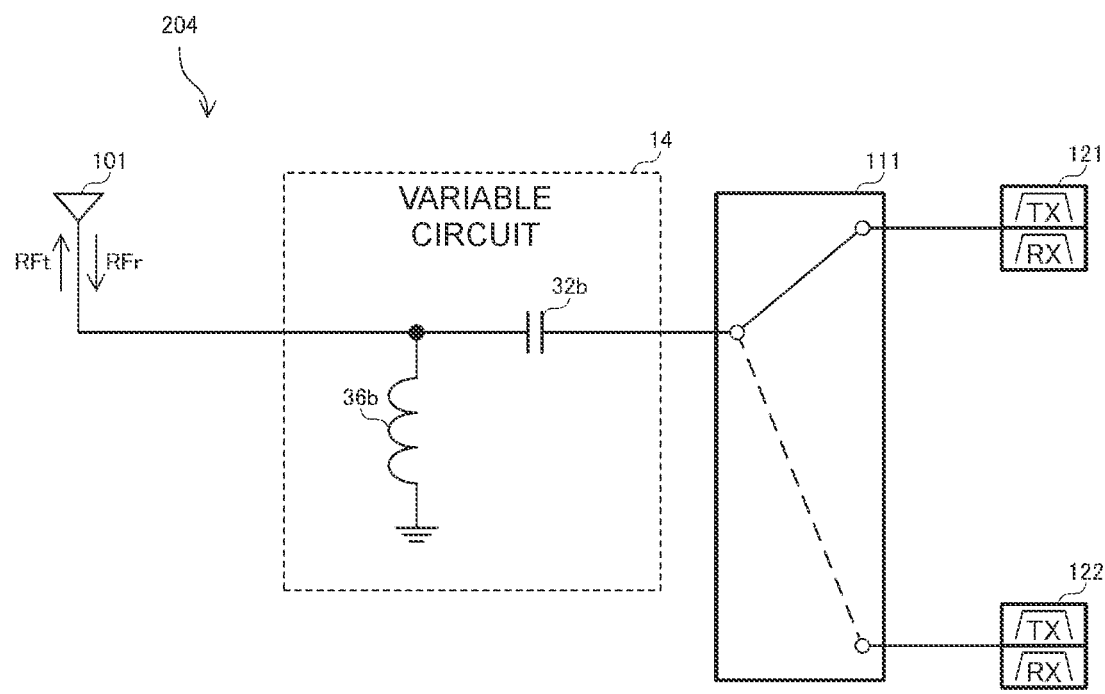
FIG. 31 is a diagram illustrating an equivalent circuit of the reception circuit 204 in the 8th-band transmission/reception state.

FIG. 31 is a diagram illustrating an equivalent circuit of the reception circuit 204 in the 8th-band transmission/reception state. For example, when the transmission/reception of radio waves in the 8th band is performed, the reception circuit 204 makes a transition to the 8th-band transmission/reception state as illustrated in FIG. 31. In the antenna switch 111 in the reception circuit 204, the first end connected to the variable circuit 14 and the second end connected to the filter 121 are connected in the 8th-band transmission/reception state.

As illustrated in FIGS. 30 and 31, the input terminal 21*a* connected to the antenna 101 is connected to the output terminal 22*z* via the internal connection path 23*bh* in the variable circuit 14. The output terminal 22*z* is connected to the input terminal 21*y* via the internal connection path 23*bj* and is also connected to the input terminal 21*z* via the intra-substrate wiring line 32*a* on which the capacitor 32*b* is disposed. The input signal RFin4 (fourth input signal) is inputted to the input terminal 21*y* via the internal connection path 23*bj*. The input terminal 21*y* is connected to the ground via the intra-substrate wiring line 36*b*. The input terminal 21*z* is connected to the first end of the antenna switch 111 via the internal connection path 23*bi* and the output terminal 22*a*.

That is, the antenna 101 is connected to the ground via the intra-substrate wiring line 36*b* functioning as an inductor in the variable circuit 14 and is also connected to the first end of the antenna switch 111 via the capacitor 32*b* in the variable circuit 14.

That is, the variable circuit 14 functions as a variable high pass filter disposed between the antenna 101 and the first end of the antenna switch 111 and also functions as an impedance matching circuit. The variable circuit 14 illustrated in FIG. 29 is less likely to pass a low-frequency signal as compared with the variable circuit 14 illustrated in FIG. 31.

Although the intra-substrate wiring line 31*a* functioning as an inductor and the intra-substrate wiring line 32*a* on which the capacitor 32*b* is disposed are exemplified in the variable circuits 11, 12, 13*a*, 13*b*, and 14, the configuration does not necessarily have to be employed. A configuration may be employed in which another passive element such as a resistance element or an active element such as a diode or a transistor is disposed on an intra-substrate wiring line. A configuration may be employed in which two or more passive elements, two or more active elements, or the combination of a passive element and an active element are disposed on a single intra-substrate wiring line. A passive element and an active element may be elements formed on a substrate or SMDs. The input terminals or output terminals of the variable circuits 11, 12, 13*a*, 13*b*, and 14 and, for example, a passive or active element are electrically connected via, for example, an electrode and a wiring line formed on a substrate, wire bonding connecting substrates, and a member such as a bump for electric connection.

Although the configuration has been described in which the switch 20*a* has the input terminals 21*a*, 21*b*, and 21*z* and the output terminals 22*a*, 22*b*, and 22*z* in the variable circuit 11, the configuration does not necessarily have to be employed. A possible benefit of the present disclosure can be achieved even with the configuration in which the switch 20*a* includes at least the input terminals 21*a* and 21*b* and the output terminals 22*a* and 22*b*.

Although the configuration has been described in which the inductor functions of the intra-substrate wiring lines 31*a* and 31*b* are obtained by the use of windings such as the intra-substrate wiring lines 300, 320, and 340 in, for example, the variable circuit 11, the configuration does not necessarily have to be employed. A configuration may be employed in which the inductor functions of the intra-substrate wiring lines 31*a* and 31*b* are obtained by the use of, for example, transmission lines forming inductors in a TLT (transmission line transformer).

Although the configuration has been described in which, for example, the switch 20*b* in the variable circuit 12 forms the internal connection path 23*ba* electrically connecting the input terminal 21*a*, which is one of the multiple input terminals, and the output terminal 22*b*, which is one of the multiple output terminals and the internal connection path 23*bc* electrically connecting the input terminal 21*a* and the output terminal 22*z*, which is one of the multiple output terminals, the configuration does not necessarily have to be employed. A configuration may be employed in which a switch forms a plurality of internal connection paths electrically connecting any one of a plurality of input terminals and three or more of a plurality of output terminals.

Although the configuration has been described in which, for example, the switch 20*b* in the variable circuit 12 forms the internal connection path 23*bb* electrically connecting the input terminal 21*b*, which is one of the multiple input terminals, and the output terminal 22*a*, which is one of the multiple output terminals and the internal connection path 23*bd* electrically connecting the input terminal 21*z*, which is one of the multiple input terminals, and the output terminal 22*a*, the configuration does not necessarily have to be employed. A configuration may be employed in which a switch forms a plurality of internal connection paths electrically connecting three or more of a plurality of input terminals and any one of a plurality of output terminals.

Although the configuration has been described in which, for example, the switch 20*bb* in the variable circuit 13*b* forms the internal connection path 23*bh* electrically connecting the output terminal 22*z*, which is one of the multiple input terminals and the multiple output terminals, and the input terminal 21*a*, which is one of the multiple input terminals and the multiple output terminals excluding the output terminal 22*z* and the internal connection path 23*bj* electrically connecting the output terminal 22*z* and the input terminal 21*y*, which is one of the multiple input terminals and the multiple output terminals excluding the output terminal 22*z*, the configuration does not necessarily have to be employed. A configuration may be employed in which a switch forms a plurality of internal connection paths electrically connecting any one of a plurality of output terminals and three or more of a plurality of input terminals and a plurality of output terminals excluding the output terminal.

Although the configuration has been described in which, for example, the switch 20*bb* in the variable circuit 13*b* forms the internal connection path 23*bh* electrically connecting the output terminal 22*z*, which is one of the multiple input terminals and the multiple output terminals and from which the input signal RFin3 is outputted, and the input terminal 21a, which is one of the multiple input terminals and the multiple output terminals excluding the output terminal 22z and to which the input signal RFin1 is inputted and the internal connection path 23bj electrically connecting the output terminal 22z and the input terminal 21y, which is one of the multiple input terminals and the multiple output terminals excluding the output terminal 22z and from which the input signal RFin4 is outputted, the configuration does not necessarily have to be employed. A configuration may be employed in which a switch forms a plurality of internal connection paths electrically connecting any one of a plurality of input terminals and two or more of a plurality of input terminals and a plurality of output terminals excluding the input terminal.

The exemplary embodiments of the present disclosure have been described above. The variable circuit 11 includes the switch 20a including a plurality of input terminals and a plurality of output terminals. The multiple input terminals include the input terminal 21a to which the input signal RFin1 is inputted and the input terminal 21b to which the input signal RFin2 is inputted. The multiple output terminals include the output terminal 22a from which the output signal RFout1 is outputted and the output terminal 22b from which the output signal RFout2 is outputted. The switch 20a is capable of forming at least one internal connection path electrically connecting any one of the multiple input terminals and any one of the multiple output terminals. The intra-substrate wiring line 31a is configured to electrically connect the output terminal 22b to the input terminal 21b such that the output signal RFout2 outputted from the output terminal 22b is inputted to the input terminal 21b as the input signal RFin2. The intra-substrate wiring line 31a is disposed outside the switch 20a.

With this configuration, at least a circuit for transmitting a signal to the intra-substrate wiring line 31a and a circuit for bypassing a signal from the input terminal 21a to the output terminal 22a can be obtained by switching internal connection path formation patterns. The number of connection patterns of circuits that the variable circuit 11 can form can be easily increased by, for example, connecting another intra-substrate wiring line to another output terminal, connecting another intra-substrate wiring line to another input terminal, or connecting another intra-substrate wiring line between another output terminal and another input terminal. That is, the single switch 20a allows the variable circuit 11 to have various functions. As a result, the variable circuit 11 can be reduced in size as compared with the configuration in which respective switches are connected in parallel to a plurality of series-connected inductors, and the variation in circuit characteristics due to the variation in switch characteristics can be suppressed. Accordingly, a variable circuit with which the increase in size is suppressed can be provided.

In the variable circuit 11, the multiple input terminals further include the input terminal 21z to which the input signal RFin3 is inputted. The multiple output terminals further include the output terminal 22z from which the output signal RFout3 is outputted. The intra-substrate wiring line 31b is configured to electrically connect the output terminal 22z to the input terminal 21z such that the output signal RFout3 outputted from the output terminal 22z is inputted to the input terminal 21z as the input signal RFin3. The intra-substrate wiring line 31b is disposed outside the switch 20a.

With this configuration, at least a circuit for transmitting a signal to the intra-substrate wiring line 31a, a circuit for transmitting a signal to the intra-substrate wiring line 31b, a circuit for transmitting a signal to the intra-substrate wiring lines 31a and 31b, and a circuit for bypassing a signal from the input terminal 21a to the output terminal 22a can be obtained by switching internal connection path formation patterns. For example, in the case where the intra-substrate wiring lines 31a and 31b function as inductors, the variable circuit 11 can therefore function as a variable inductance circuit or a circuit for bypassing a signal.

In the variable circuit 13b, the multiple output terminals further include the input terminal 21y to which the input signal RFin4 is inputted via the internal connection path 23bj. The intra-substrate wiring line 36b has the first end electrically connected to the input terminal 21y and the second end connected to the ground. The intra-substrate wiring line 36b is disposed outside the switch 20bb.

With this configuration, the circuit formed by the variable circuit 13b can be partly connected to the ground via the input terminal 21y and the intra-substrate wiring line 36b. In the variable circuit 13b, for example, a filter circuit, a matching circuit, or a termination circuit configured to flow a noise component to the ground via the input terminal 21y and the intra-substrate wiring line 36b can therefore be formed. Specifically, in the variable circuit 13b, a circuit is branched off from one end of the intra-substrate wiring line 32a connected to the output terminal 22z and can be connected to the ground via the output terminal 22z, the input terminal 21y, and the intra-substrate wiring line 36b. As a result, a filter circuit including the intra-substrate wiring line 36b functioning as an inductor can be disposed in the preceding stage of the intra-substrate wiring line 32a functioning as a capacitor.

In the variable circuit 13a, the multiple output terminals further include the output terminal 22y to which the input signal RFin5 is inputted via the internal connection path 23bg. The intra-substrate wiring line 36a has the first end electrically connected to the output terminal 22y and the second end connected to the ground. The intra-substrate wiring line 36a is disposed outside the switch 20ba.

With this configuration, the circuit formed by the variable circuit 13a can be partly connected to the ground via the output terminal 22y and the intra-substrate wiring line 36a. In the variable circuit 13a, for example, a filter circuit, a matching circuit, or a termination circuit configured to flow a noise component to the ground via the output terminal 22y and the intra-substrate wiring line 36a can therefore be formed. Specifically, in the variable circuit 13a, a circuit is branched off from the input terminal 21a and can be connected to the ground via the output terminal 22z, the intra-substrate wiring line 32a, the input terminal 21z, the output terminal 22y, and the intra-substrate wiring line 36a. As a result, a series LC filter circuit including the intra-substrate wiring line 32a functioning as a capacitor and the intra-substrate wiring line 36a functioning as an inductor can be disposed.

In the variable circuit 12, the switch 20b is further capable of forming the internal connection path 23ba electrically connecting the input terminal 21a, which is one of the multiple input terminals, and the output terminal 22b, which is one of the multiple output terminals, and the internal connection path 23bc electrically connecting the input terminal 21a and the output terminal 22z, which is one of the multiple output terminals.

With this configuration, the number of connection patterns of circuits that the variable circuit 12 can form can be effectively increased because the formation and elimination of a circuit branch can be easily performed by the use of an input terminal.

In the variable circuit 12, the switch 20b is further capable of forming the internal connection path 23bb electrically connecting the input terminal 21b, which is one of the multiple input terminals, and the output terminal 22a, which is one of the multiple output terminals, and the internal connection path 23bd electrically connecting the input terminal 21z, which is one of the multiple input terminals, and the output terminal 22a.

With this configuration, the number of connection patterns of circuits that the variable circuit 12 can form can be effectively increased because the formation and elimination of a circuit branch can be easily performed by the use of an output terminal. For example, in the case where a circuit is branched off from both an input terminal and an output terminal, the intra-substrate wiring lines 31a and 31b can be connected in series or parallel like in the variable circuit 12. That is, a circuit for transmitting a signal to the intra-substrate wiring line 31a, a circuit for transmitting a signal to the intra-substrate wiring line 31b, a circuit for transmitting a signal to the series-connected intra-substrate wiring lines 31a and 31b, a circuit for transmitting a signal to the parallel-connected intra-substrate wiring lines 31a and 31b, and a circuit for bypassing a signal from the input terminal 21a to the output terminal 22a can be easily obtained. As a result, the compact variable circuit 12 having four patterns of inductance as circuit constants can be provided by the use of the single switch 20b and the two intra-substrate wiring lines. In the variable circuit 12, an inductance adjustment range can be increased or an adjustment interval can be shortened.

In the variable circuit 13b, the switch 20bb is further capable of forming the internal connection path 23bh electrically connecting the output terminal 22z, which is one of the multiple input terminals and the multiple output terminals, and the input terminal 21a, which is one of the multiple input terminals and the multiple output terminals excluding the output terminal 22z, and the internal connection path 23bj electrically connecting the output terminal 22z and the input terminal 21y, which is one of the multiple input terminals and the multiple output terminals excluding the output terminal 22z.

With this configuration, the number of connection patterns of circuits that the variable circuit 13b can form can be effectively increased because the formation and elimination of a circuit that branches off from the output terminal 22z and is connected to the ground via the intra-substrate wiring line 36b can be easily performed.

In the variable circuit 13a, the capacitor 32b, which is an example of an element, is disposed on the intra-substrate wiring line 32a.

With this configuration, for example, a plurality of circuit patterns having different connection modes of the capacitor 32b can be easily obtained.

In the variable circuit 11, the intra-substrate wiring line 31a functions as an inductor.

With this configuration, a plurality of circuit patterns having different connection modes of the intra-substrate wiring line 31a functioning as an inductor can be easily obtained.

In the variable circuit 11, the intra-substrate wiring lines 31a and 31b are disposed on a substrate.

Thus, with the configuration in which the input terminals and the output terminals are connected to the intra-substrate wiring lines 31a and 31b disposed on a substrate with a high degree of design freedom, the variable circuit 11 can be easily provided which is capable of switching between connection modes of the intra-substrate wiring lines 31a and 31b optimized for layout and size. A variable circuit can be easily provided which is capable of switching between connection modes of, for example, an intra-substrate wiring line on which an element optimized for layout, type, and size is disposed.

The embodiments described above are intended to help easily understand the present disclosure and are not to be used to construe the present disclosure in a limiting fashion. The present disclosure may be modified or improved without departing from the gist thereof, and equivalents of such modifications or improvements are also included in the present disclosure. That is, each of the embodiments may be appropriately modified in design by those skilled in the art, and such modifications also fall within the scope of the present disclosure so long as the modifications include the features of the present disclosure. For example, elements included in each of the embodiments and the arrangements, materials, conditions, shapes, sizes, and so on thereof are not limited to those illustrated exemplarily but can be modified as appropriate. The embodiments are merely illustrative, configurations according to the different embodiments may be partially exchanged or combined, and such exchanges or combinations of the configurations also fall within the scope of the present disclosure so long as the exchanges or combinations of the configurations include the features of the present disclosure.

11, 12, 13a, 13b, and 14 variable circuit
20a, 20b, 20ba, 20bb, and 20bc switch
21a, 21b, 21y, and 21z input terminal
22a, 22b, 22y, and 22z output terminal
23 internal connection path
31 intra-substrate wiring line
32 intra-substrate wiring line
32b capacitor
36 intra-substrate wiring line
37 intra-substrate wiring line
37aa and 37ba capacitor
101 antenna
102 capacitor
111 antenna switch
112 switch
113 low-noise amplifier
121, 122, 123, 124 filter
131 output terminal
201, 202, 203, and 204 reception circuit
300 intra-substrate wiring line
301 first-layer conductor
302 second-layer conductor
303 third-layer conductor
304 fourth-layer conductor
311, 312, 313, and 314 via
320 intra-substrate wiring line
321 first-layer conductor
322 second-layer conductor
323 third-layer conductor
324 fourth-layer conductor
331, 332, and 333 via
340 intra-substrate wiring line
341 first-layer conductor
342 second-layer conductor
351 via

The invention claimed is:

1. A variable circuit comprising:
a switch comprising a plurality of input terminals and a plurality of output terminals; and
an external wiring line,
wherein the plurality of input terminals comprises a first input terminal to which a first input signal is input and a second input terminal to which a second input signal is input,
wherein the plurality of output terminals comprises a first output terminal from which a first output signal is output and a second output terminal from which a second output signal is output,
wherein the switch is configured to form at least one internal connection path electrically connecting any one of the plurality of input terminals to any one of the plurality of output terminals, and
wherein the external wiring line is outside the switch and is configured to electrically connect the second output terminal to the second input terminal such that the second output signal output from the second output terminal is input to the second input terminal as the second input signal.

2. The variable circuit according to claim 1,
wherein the plurality of input terminals further comprises a third input terminal to which a third input signal is input,
wherein the plurality of output terminals further comprises a third output terminal from which a third output signal is output,
wherein the variable circuit further comprises a second external wiring line that is configured to electrically connect the third output terminal to the third input terminal such that the third output signal output from the third output terminal is input to the third input terminal as the third input signal, and
wherein the second external wiring line is outside the switch.

3. The variable circuit according to claim 2, wherein the switch is further configured to form a plurality of the internal connection paths electrically connecting any one of the plurality of input terminals and the plurality of output terminals to two or more of the plurality of input terminals and the plurality of output terminals.

4. The variable circuit according to claim 1,
wherein the plurality of output terminals further comprises a fourth output terminal to which a fourth input signal is input via the at least one internal connection path,
wherein the variable circuit further comprises a second external wiring line that has a first end electrically connected to the fourth output terminal and a second end connected to ground, and
wherein the second external wiring line is outside the switch.

5. The variable circuit according to claim 1, wherein a circuit element is on the external wiring line.

6. The variable circuit according to claim 1, wherein the external wiring line is an inductor.

7. The variable circuit according to claim 1, wherein the external wiring line is on or in a substrate.

* * * * *

UNITED STATES PATENT AND TRADEMARK OFFICE
CERTIFICATE OF CORRECTION

PATENT NO. : 12,283,409 B2
APPLICATION NO. : 18/361313
DATED : April 22, 2025
INVENTOR(S) : Katsuya Ikegami and Wataru Takahashi It is certified that error appears in the above-identified patent and that said Letters Patent is hereby corrected as shown below:

In the Specification

At Column 13, Line 11, "paths 23bk and 23bi" should read --paths 23bh and 23bi--.

Signed and Sealed this
Twenty-seventh Day of May, 2025

Coke Morgan Stewart
*Acting Director of the United States Patent and Trademark Office*